(12) United States Patent
Achir et al.

(10) Patent No.: US 10,177,792 B2
(45) Date of Patent: Jan. 8, 2019

(54) DC-FREE NYQUIST-FREE ERROR CORRECTING LINE CODING

(71) Applicant: CANON KABUSHIKI KAISHA, Tokyo (JP)

(72) Inventors: Mounir Achir, Chantepie (FR); François Thoumy, Vignoc (FR)

(73) Assignee: CANON KABUSHIKI KAISHA, Tokyo (JP)

( * ) Notice: Subject to any disclaimer, the term of this patent is extended or adjusted under 35 U.S.C. 154(b) by 133 days.

(21) Appl. No.: 14/868,140

(22) Filed: Sep. 28, 2015

(65) Prior Publication Data

US 2016/0094248 A1   Mar. 31, 2016

(30) Foreign Application Priority Data

Sep. 30, 2014 (GB) .................... 1417280.3

(51) Int. Cl.
| | | |
|---|---|---|
| *H03M 13/35* | (2006.01) | |
| *H03M 13/00* | (2006.01) | |
| *H03M 13/31* | (2006.01) | |
| *H03M 13/19* | (2006.01) | |

(52) U.S. Cl.
CPC .......... *H03M 13/31* (2013.01); *H03M 13/19* (2013.01)

(58) Field of Classification Search
None
See application file for complete search history.

(56) References Cited

U.S. PATENT DOCUMENTS

| | | | | |
|---|---|---|---|---|
| 5,280,489 A | | 1/1994 | Fredrickson et al. | |
| 5,892,466 A | * | 4/1999 | Walker | H04L 25/4925 341/57 |
| 6,188,337 B1 | * | 2/2001 | Soljanin | H04L 25/4908 341/59 |
| 6,198,413 B1 | | 3/2001 | Widmer | |
| 6,366,223 B1 | * | 4/2002 | Lee | H03M 5/04 341/51 |
| 6,604,219 B1 | * | 8/2003 | Lee | G11B 20/10 341/56 |
| 6,961,010 B2 | * | 11/2005 | Tsang | H03M 5/145 341/58 |
| 6,985,094 B2 | * | 1/2006 | Kem | H03M 5/145 341/58 |
| 7,002,492 B2 | * | 2/2006 | Tsang | G11B 20/1426 341/58 |
| 7,038,599 B2 | * | 5/2006 | Kahlman | G11B 20/1426 341/58 |
| 7,084,789 B2 | * | 8/2006 | Varanasi | H03M 5/145 341/58 |

(Continued)

*Primary Examiner* — Justin R Knapp

(74) *Attorney, Agent, or Firm* — Canon U.S.A., Inc. IP Division

(57) ABSTRACT

A method of encoding a bitstream includes obtaining at least one current input word of the bitstream to encode, determining at least one nominal codeword associated with the at least one input word according to an error-control code, selecting one of the at least one nominal codeword or a substitute codeword in order to keep a current running digital sum and/or a running alternate sum bounded, and outputting an encoded word comprising the selected codeword. Embodiments make it possible to generate an encoded bitstream which is "DC free" and "Nyquist free" while providing error correction with a fixed coding rate.

12 Claims, 16 Drawing Sheets

(56) References Cited

U.S. PATENT DOCUMENTS

| | | | |
|---|---|---|---|
| 7,423,561 B2 * | 9/2008 | Chen | G11B 20/1426 341/59 |
| 9,431,053 B2 * | 8/2016 | Cai | G11B 20/1403 |
| 2004/0263362 A1 * | 12/2004 | Van Den Enden | G11B 20/1426 341/58 |
| 2005/0104754 A1 * | 5/2005 | Varanasi | H03M 5/145 341/59 |

* cited by examiner

| Uncoded word | Codeword | DS | AS |
|---|---|---|---|
| 0000 | 00000000 | -8 | 0 |
| 0001 | 11010010 | 0 | 0 |
| 0010 | 01010101 | 0 | 8 |
| 0011 | 10000111 | 0 | 0 |
| 0100 | 10011001 | 0 | 0 |
| 0101 | 01001011 | 0 | 0 |
| 0110 | 11001100 | 0 | 0 |
| 0111 | 00011110 | 0 | 0 |
| 1000 | 11100001 | 0 | 0 |
| 1001 | 00110011 | 0 | 0 |
| 1010 | 10110100 | 0 | 0 |
| 1011 | 01100110 | 0 | 0 |
| 1100 | 01111000 | 0 | 0 |
| 1101 | 10101010 | 0 | -8 |
| 1110 | 00101101 | 0 | 0 |
| 1111 | 11111111 | 8 | 0 |

4 uncoded words create non null RDS or RAS

Figure 9

| Uncoded word | Codeword | RDS | RAS |
|---|---|---|---|
| 0000 | 00000000 11111111 | 0 | 0 |
| 0001 | 11010010 | 0 | 0 |
| 0010 | 01010101 10101010 | 0 | 0 |
| 0011 | 10000111 | 0 | 0 |
| 0100 | 10011001 | 0 | 0 |
| 0101 | 01001011 | 0 | 0 |
| 0110 | 11001100 | 0 | 0 |
| 0111 | 00011110 | 0 | 0 |
| 1000 | 11100001 | 0 | 0 |
| 1001 | 00110011 | 0 | 0 |
| 1010 | 10110100 | 0 | 0 |
| 1011 | 01100110 | 0 | 0 |
| 1100 | 01111000 | 0 | 0 |
| 1101 | 10101010 01010101 | 0 | 0 |
| 1110 | 00101101 | 0 | 0 |
| 1111 | 11111111 00000000 | 0 | 0 |

Figure 10 null RDS and RAS

DC-FREE NYQUIST-FREE ERROR CORRECTING LINE CODING

This application claims the benefit under 35 U.S.C. § 119(a)-(d) of United Kingdom Patent Application No. 1417280.3, filed on Sep. 30, 2014 and entitled "DC-free Nyquist-free Error Correcting Line Coding". The above cited patent application is incorporated herein by reference in its entirety.

FIELD OF THE INVENTION

The present invention relates to error correction in telecommunication systems.

The invention has applications, in particular, in terahertz telecommunication systems.

BACKGROUND OF THE INVENTION

Until recently, the electromagnetic spectrum was considered as separated into two large bands. The first band includes the usual frequencies used for wireless communications and referred to as the "radio" waves. The radio waves are electromagnetic radiations having frequencies from 3 KHz up to 300 GHz. The second band starts from around 1 THz, includes radiations of the "optic" type and encompasses the infrared band, the visible band, Ultraviolet, X-Rays and the Gamma rays. The second band, referred to as the "terahertz" band that contains frequencies ranging from 100 GHz up to 10 THz and thus includes a part of the radio electromagnetic radiations and a part of the optic electromagnetic radiations.

The terahertz band is nowadays of particular interest and is considered for ultra-high speed wireless communications notably because of its large available bandwidth. Several values can be considered for the frontiers of the terahertz band. However, two bands are often used for defining the terahertz band: 100 GHz up to 10 THz and 0.3 GHz up to 3 THz.

The large available bandwidth is not the only reason why terahertz waves are of interest. The integration level and particularly the size of the antennas used for emitting and receiving such waves make this technology very easy to be integrated in the current common communication devices that are made increasingly smaller and/or thinner nowadays. Thanks to this easy integration, several applications are made possible, from ultra-high speed audio/image/video transfer between devices to intra-machine communications (i.e. wireless communication between two or more components within a same device).

However, many challenges have to be faced before bringing the terahertz communication technology to the market. The terahertz technology is not entirely mature yet even though solutions for terahertz detection at room temperature exist as disclosed in document Kallfass et al. "All Active MMIC-Based Wireless Communication at 220 GHz". IEEE Transactions on Terahertz Science and Technology Vol 1, Number 2, November 2011 or document Hiwei Xu et al. "D-Band CMOS Transmitter and Receiver for Multi-Giga-Bit/sec Wireless Data Link". 40th European Microwave Conference, September 2010.

Solutions for terahertz wave generation (at room temperature) with sufficient power for transmission at distances over the meter remain scarce for the moment. Experiments have been performed wherein only amplitude modulation has been used. However, phase modulation, in particular in heterodyne architectures, has not been experimented yet.

Reliable modular interconnection of terahertz hardware devices are missing in the prior art.

Finally, the efficiency of the antennas integrated on silicon that has been reported so far is poor. This last issue seems to be the one for which the biggest progress is to be accomplished.

In parallel to the effort in conceiving terahertz transmitters and receivers capable of transmitting and receiving wide-band modulated signals, the research community works also on the terahertz electromagnetic propagation modeling. For the terahertz waves, like for radio waves, knowing the propagation model is mandatory to well conceive and dimension the communication systems, mainly for the digital part (Modulation and coding scheme) and the antenna design. Only a few models are currently proposed for the terahertz propagation. Document Kallfass et al. "All Active MMIC-Based Wireless Communication at 220 GHz". IEEE Transactions on Terahertz Science and Technology Vol 1, Number 2, November 2011 discloses using one of the first models, which has been developed by the HSCA (Harvard-Smithsonian Center for Astrophysics). The model, which is available under a freeware that can be downloaded from the HSCA website, is called "am" for Atmospheric Model. The "am" model makes it possible to perform radiative transfer computations from microwave to sub-millimeter wavelengths. With this model, one can see that above around 350 GHz for example, the humidity has no effect and the attenuation is more severe. This "am" model is available for outdoor and for long distances.

Recently, some measurements and modeling have been carried out in order to determine the propagation behavior of the terahertz waves during specific scenarios completely different from the scenarios considered when building the "am" model. Document Sebastian Rey et al. "On Propagation Characteristics of Waveguide-like ABS-structures in 60 GHz and 300 GHz communications". IRMMW THz 2013, Mainz, Germany and document Alexander Fricke et al. "Reflection and transmission properties of plastic materials at THz frequencies". IRMMW THz 2013, Mainz, Germany report investigations concerning the behavior of the terahertz waves in indoor and intra-machine communication systems in order to characterize and determine the way terahertz waves propagate in such environment.

Document A. X. Widmer, P. A. Franaszek, "A DC-Balanced, Partitioned-Block, 8B/10B Transmission Code", IBM Journal of Research and development, vol. 27, No. 5, September 1983, pp. 440-451 discloses one of the most popular DC free code. The proposed scheme, called "8B10B" encodes each 8 bits of a digital data stream into 10 bits plus a "status information" obtained from the previous encoding. The idea is to continuously balance between the ones ("1") and the zeros ("0") so that at each time the encoded bitstream has exactly the same number of ones and the number of zeros. With such continuous balancing, the bitstream has a null mean value (it has no continuous component), it is said to be "DC free".

The "DC free" encoding modifies the inputted bitstream into an output bitstream having a bounded digital sum variation. The digital sum variation (DSV) is computed from the running digital sum (RDS) as follows (after modulating the bitstream with 1 and −1):

$$RDS = \sum_{n=1}^{J} y_n$$

The digital sum variation is computed according to the following formula:

$$DSV = \max_{I,J,\{y_n\}} |RDS| = \max_{I,J,\{y_n\}} \left| \sum_{n=I}^{J} y_n \right|$$

I and J are integers and yn are the bits of the bitstream.

For the encoding, the bitstream is subdivided into blocks of 8 bits (one byte) and presented to the encoder. Each byte is then subdivided into two sub-blocks: one sub-block comprising the five first bits and one sub-block comprising the last three bits. The first five bits are encoded using a 5b/6b code thereby obtaining 6 bits. The 5b/6b encoding is based on two tables. A first table contains codewords having more ones than zeros (or the same number of ones and zeros for some codewords in the table). A second table contains codewords having more zeros than ones (or the same number of ones and zeros for some codewords in the table).

The tables used for the 5b/6b encoding disclosed in document A. X. Widmer, P. A. Franaszek, "A DC-Balanced, Partitioned-Block, 8B/10B Transmission Code", IBM Journal of Research and development, vol. 27, No. 5, September 1983, pp. 440-451. are listed below. In table "table_5b_6b_RD_plus", codewords have a number of zeros at least equal to the number of ones. In table "table_5b_6b_RD_minus", the codewords have a number of ones at least equal to the number of zeros.

table_5b_6b_RD_plus=[0 1 1 0 0 0;
1 0 0 0 1 0;
0 1 0 0 1 0;
1 1 0 0 0 1;
0 0 1 0 1 0;
0 0 0 1 1 0;
1 0 0 1 0 1;
0 1 0 1 0 1;
1 1 0 1 0 0;
0 0 1 1 0 1;
1 0 1 1 0 0;
0 1 1 1 0 0;
1 0 1 0 0 0;
1 0 0 1 0 0;
1 0 0 0 1 1;
0 1 0 0 1 1;
1 1 0 0 1 0;
0 0 1 0 1 1;
1 0 1 0 1 0;
0 1 1 0 1 0;
0 0 0 1 0 1;
0 0 1 1 0 0;
1 0 0 1 1 0;
0 1 0 1 1 0;
0 0 1 0 0 1;
0 0 1 1 1 0;
0 1 0 0 0 1;
1 0 0 0 0 1;
0 1 0 1 0 0];
table_5b_6b_RD_minus=[1 0 0 1 1 1;
0 1 1 1 0 1;
1 0 1 1 0 1;
1 1 0 0 0 1;
1 1 0 1 0 1;
1 0 1 0 0 1;
0 1 1 0 0 1;
1 1 1 0 0 0;
1 1 1 0 0 1;
1 0 0 1 0 1;
0 1 0 1 0 1;
1 1 0 1 0 0;
0 0 1 1 0 1;
1 0 1 1 0 0;
0 1 1 1 0 0;
0 1 0 1 1 1;
0 1 1 0 1 1;
1 0 0 0 1 1;
0 1 0 0 1 1;
1 1 0 0 1 0;
1 1 1 0 1 0;
1 1 0 0 1 1;
1 0 0 1 1 0;
0 1 0 1 1 0;
1 1 0 1 1 0;
0 0 1 1 1 0;
1 0 1 1 1 0;
0 1 1 1 1 0;
1 0 1 0 1 1];

The tables used for the 3b/4b encoding disclosed in document A. X. Widmer, P. A. Franaszek, "A DC-Balanced, Partitioned-Block, 8B/10B Transmission Code", IBM Journal of Research and development, vol. 27, No. 5, September 1983, pp. 440-451. are listed below. In table "table_3b_4b_RD_plus", the codewords have a number of zeros at least equal to the number of ones. In table "table_3b_4b_RD_minus", the codewords have a number of ones at least equal to the number of zeros.

table_3b_4b_RD_plus=[0 1 0 0;
1 0 0 1;
0 1 0 1;
0 0 1 1;
0 0 1 0;
1 0 1 0;
0 1 1 0;
0 0 0 1;
1 0 0 0];
table_3b_4b_RD_minus=[1 0 1 1;
1 0 0 1;
0 1 0 1;
1 1 0 0;
1 1 0 1;
1 0 1 0;
0 1 1 0;
1 1 1 0;
0 1 1 1];

Let's consider encoding of the following byte: 0 0 0 0 1 0 0 1. The encoded word would be:

0 1 1 0 0 0 1 0 1 1 when the initial running disparity is equal: +1;

1 0 0 1 1 1 0 1 0 0 when the initial running disparity is equal: −1.

The running disparity is defined in document A. X. Widmer, P. A. Franaszek, "A DC-Balanced, Partitioned-Block, 8B/10B Transmission Code", IBM Journal of Research and development, vol. 27, No. 5, September 1983, pp. 440-451. It is defined as the number of ones minus the number of zeros for each encoded 6 bits (respectively 4 bits) at the output of the 5b/6b (respectively the 3b/4b) encoder.

If the running disparity is equal to +1, the byte to be encoded (i.e. 0 0 0 0 1 0 0 1; see the example above) is divided into two parts: five first bits (i.e. 0 0 0 0 1) and three last bits (i.e. 0 0 1).

In the present example, the running disparity is equal to +1, then the 5b/6b encodes the five first bits with: 0 1 1 0 0

0 (since 0 0 0 0 1 corresponds to 1 in decimal so the first word in the table is selected as 5b/6b codeword). The new running disparity is thus equal to: +1+(2−4)=−1 (+1 is the previous/initial running disparity and (2−4) is the running disparity of the encoded word (0 1 1 0 0 0).

Since the updated running disparity is equal to −1, table table_3b_4b_RD_minus is used for the 3b/4b encoding. The output is equal to: 1 0 1 1. For each byte to be encoded two codewords are possible (positive or negative running disparity).

In document D. Y. Young Kim et al. "White paper on the MB810 Line Code for 10 GbE", proposal for 10 Gigabit Ethernet (IEEE 802.3), document S. Kang et al. "MB810, Dual mode Encoder/Decoder, and MB810 code generating method" and document US2005/0012646 the authors disclosed a new line coding scheme providing a spectrum having null power at the null frequency and a null power at the Nyquist frequency (i.e. half the sampling frequency), other words a "DC free" and "Nyquist free" line code.

A code parameter called "running alternate sum" (RAS) is considered for building the code:

$$RAS = \sum_{n=I}^{J} (-1)^n y_n$$

I and J are integers, yn are the bits of the bitstream. The RAS is the sum of the coded output symbols within an arbitrary interval between tn=I and n=J, with alternating polarity. Similarly to the Running Digital Sum, a parameter named "Alternative Sum Variation" (ASV) is computed according to the following equation:

$$ASV = \max_{I,J,\{y_n\}} |RAS| = \max_{I,J,\{y_n\}} \left| \sum_{n=I}^{J} (-1)^n y_n \right|$$

If the ASV is finite, then the bitstream yn has a spectrum component null at the Nyquist frequency.

For example, let's consider the binary sequence "1100", the DS (Digital Sum) computation gives:

DS=1+1−1−1=0

The AS (Alternate Sum) is:

AS=−1+1+1−1=0

The DS and the AS of the above binary sequence are null. In addition, shifting this binary sequence, as explained below, provides the same values for AS and DS:

"1001"=>DS=1−1−1+1=0

AS=−1−1+1+1=0

"0011"=>DS=−1−1+1+1=0

AS=+1−1−1+1=0

"0110"=>DS=−1+1+1−1=0

AS=+1+1−1−1=0

The line code MB24 has the following codebook {1100, 1001,0011,0110}. The MB24 line code is thus a DC free and Nyquist free line code. The MB24 encoding is defined by the table below:

| Uncoded word | Codeword |
|---|---|
| 00 | 1001 |
| 01 | 0011 |
| 10 | 1100 |
| 11 | 0110 |

Decoding a MB24 line code is straightforward. Indeed, one can see from the above table that the two bits in the middle of each codeword correspond to the uncoded word. The decoder architecture is very simple.

Similar construction can be done in order to design the MB12 and the MB34 line codes.

The following table illustrates the encoding process for the MB12 code:

| State | Input | Output | Next state |
|---|---|---|---|
| S1 | 0 | 11 | S4 |
| S1 | 1 | 01 | S2 |
| S2 | 0 | 11 | S3 |
| S2 | 1 | 10 | S1 |
| S3 | 0 | 00 | S2 |
| S3 | 1 | 10 | S4 |
| S4 | 0 | 00 | S1 |
| S4 | 1 | 01 | S3 |

The MB12 encoder is initialized to state S1 and then according to the input bit and the table above two output bits are selected and the current state of the encoder is updated.

The following table illustrates the encoding process for the MB34 code:

| State | Input | Output | Next state |
|---|---|---|---|
| S1 | 000 | 0011 | S1 |
| S1 | 001 | 0110 | S1 |
| S1 | 010 | 1001 | S1 |
| S1 | 011 | 1100 | S1 |
| S1 | 100 | 1011 | S2 |
| S1 | 101 | 1111 | S3 |
| S1 | 110 | 1101 | S4 |
| S1 | 111 | 0111 | S4 |
| S2 | 000 | 0011 | S2 |
| S2 | 001 | 0110 | S2 |
| S2 | 010 | 1001 | S2 |
| S2 | 011 | 1100 | S2 |
| S2 | 100 | 0001 | S1 |
| S2 | 101 | 0100 | S1 |
| S2 | 110 | 1101 | S3 |
| S2 | 111 | 0101 | S4 |
| S3 | 000 | 0011 | S3 |
| S3 | 001 | 0110 | S3 |
| S3 | 010 | 1001 | S3 |
| S3 | 011 | 1100 | S3 |
| S3 | 100 | 0000 | S1 |
| S3 | 101 | 0010 | S2 |
| S3 | 110 | 1000 | S2 |
| S3 | 111 | 0100 | S4 |
| S4 | 000 | 0011 | S4 |
| S4 | 001 | 0110 | S4 |
| S4 | 010 | 1001 | S4 |
| S4 | 011 | 1100 | S4 |
| S4 | 100 | 0010 | S1 |
| S4 | 101 | 1010 | S2 |
| S4 | 110 | 1110 | S3 |
| S4 | 111 | 1011 | S3 |

The MB34 encoder is initialized to state S1 and then according to three input bits and the table above, four output bits are selected and the current state of the encoder is updated.

An example of the MB810 is illustrated and deeply discussed in document S. Kang et al. "MB810, Dual mode Encoder/Decoder, and MB810 code generating method" and document US2005/0012646.

Other codes are disclosed in the prior art that deal with the DC free or DC free and Nyquist free characteristics.

The code proposed in document M-C. Chiu, "*DC Free Error Correcting Codes Based on Convolutional Codes*", IEEE Transaction on Communications, Vol. 49, N. 4, April 2001 uses the convolutional codes for building a DC free error correcting code. This code is built by preforming an XOR operation between two convolutional codes. It is thus a linear combination of these two codes.

The first convolutional code is used in order to encode the uncoded sequence. Let's consider a(D) as the source input (represented in the polynomial format), x(d) being the encoded sequence and G1(D) the polynomial generator matrix of the first convolutional code. The first operation is to perform the encoding: x(D)=a(D). G1(D). A second step is to perform a second encoding based on a second convolutional code. In this second step, the Viterbi algorithm is performed on the trellis of the second convolutional code in order to find a codeword b(D) (b(D) is a codeword belonging to the second convolutional code codebook). The codeword b(D) is then added to the codeword x(D):y(D) =x(D)+b(D) =a(D) G1(D)+u(D) G2(D)=[a(D) u(D)]. [G1(D) G2(D)]T At the decoder side, the classical Viterbi Algorithm is applied on the received sequence by using the trellis of the following code: G(D)=[G1(D) G2(D)]T. This method generates a DC free Error Code and can be applied with many convolutional codes. The performances depend on the characteristics of the selected convolutional codes. A list of preferable convolutional codes, for both C1 and C2, is disclosed in document M-C. Chiu, "*DC Free Error Correcting Codes Based on Convolutional Codes*", IEEE Transaction on Communications, Vol. 49, N. 4, April 2001 in two tables.

The code disclosed in document J. G. Kim, "*An improved DC free Nyquist free Error Control Line Code*", ICCS'94, November 1994, Singapore uses the extended Hamming code for building a "DC free" and "Nyquist free" error correcting code.

The (8,4) extended Hamming code has some interesting characteristics since 12 among 16 of the codebook codewords have a null running digital sum and a null alternate digital sum as shown in the table below.

| Uncoded word | Codeword | DS | AS |
|---|---|---|---|
| 0000 | 00000000 | −8 | 0 |
| 0001 | 11010010 | 0 | 0 |
| 0010 | 01010101 | 0 | 8 |
| 0011 | 10000111 | 0 | 0 |
| 0100 | 10011001 | 0 | 0 |
| 0101 | 01001011 | 0 | 0 |
| 0110 | 11001100 | 0 | 0 |
| 0111 | 00011110 | 0 | 0 |
| 1000 | 11100001 | 0 | 0 |
| 1001 | 00110011 | 0 | 0 |
| 1010 | 10110100 | 0 | 0 |
| 1011 | 01100110 | 0 | 0 |
| 1100 | 01111000 | 0 | 0 |
| 1101 | 10101010 | 0 | −8 |
| 1110 | 00101101 | 0 | 0 |
| 1111 | 11111111 | 8 | 0 |

In document J. G. Kim, "*An improved DC free Nyquist free Error Control Line Code*", ICCS'94, November 1994, Singapore, the idea is to build a new code starting from a part of the codewords listed in the above table. Twelve of these codewords have a null DS and a null AS. Thus, a table containing 144 codewords of 16 bits can be built by concatenating two by two the codewords of the table. This new table contains 144 codewords of 16 bits, each one having a null running digital sum and a null running alternate sum. A third table is obtained by selecting only 128 codewords out of 144 codewords of the second table. With this third table having 128 codewords, one can encode a seven bits word to a 16 bits codeword belonging to the third table (since $2^7$=128). The coding rate that is obtained is 7/16=0.4375.

However, there is still a need for new DC free and Nyquist free line coding with error correction capabilities.

The present invention lies within this context.

SUMMARY OF THE INVENTION

According to a first aspect of the invention there is provided a method of encoding a bitstream comprising:
  obtaining at least one current input word of the bitstream to encode,
  determining at least one nominal codeword associated with said at least one input word according to an error-control code,
  selecting one of said at least one nominal codeword or a substitute codeword in order to keep a current running digital sum and/or a running alternate sum bounded, and
  outputting an encoded word comprising the selected codeword.

The nominal codeword may be a predefined codeword. For example, the nominal codeword is selected from a codebook which has the current input word as an entry.

Embodiments make it possible to generate an encoded bitstream which is "DC free" and "Nyquist free" while providing error correction with a fixed coding rate. A "DC free" bitstream is a bitstream with a continuous component (the component at frequency f=0 Hz) that is null (in other words, the bitstream's spectrum does no comprise a continuous component). A "Nyquist free" bitstream is a bitstream with a component at half the sampling frequency that is null (in other words, the bitstream's spectrum does no comprise a component at frequency f=½×the sampling frequency).

According to embodiments, the codewords used for encoding make it possible to have an encoded bitstream with a bounded running digital sum (RDS) and a bounded running alternate sum (RAS).

Embodiments provide improved performance in terms of bit error rate (BER).

Embodiments can be implemented in a non-complex fashion at encoders and decoders.

For example, the method further comprises determining a digital sum and/or an alternate sum of said nominal codeword and said selecting step is performed based on said digital sum and/or alternate sum determined.

According to embodiments, the method comprises:
  obtaining a plurality of input words of the bitstream,
  determining a plurality of nominal codewords associated with said plurality of input words according to said error-control code,
  and an encoded word is outputted for each nominal codeword and said current running digital sum and/or running alternate sum is of an encoded bitstream comprising the encoded words.

According to embodiments, the nominal codeword is a Hamming codeword.

According to embodiments, the method further comprises signalling when a substitute codeword is outputted.

For example, said encoded word further comprises a parity bit code and wherein said parity bit code is indicative of whether a nominal codeword or a substitute codeword is outputted.

Therefore, when using, for example, the digital sum and/or alternate sum values, the action of substitution can adjust one of the running sums without disturbing the other (no trade-off is required). This is the case, for example, since the digital sum and the alternate sum cannot be non-null at the same time.

For example, the substitute codeword has a negative digital sum and/or a negative alternate sum when the digital sum and/or the alternate sum of a previous codeword used for encoding a previous input word is positive.

According to embodiments, the substitute codeword has a positive digital sum and/or a positive alternate sum when the digital sum and/or the alternate sum of a previous codeword used for encoding a previous input word is negative.

According to embodiments, said substitute codeword has a digital sum and/or an alternate sum that keeps the current running digital sum and/or the running alternate sum null.

For example, said substitute codeword has a same size as the nominal codeword.

For example, said substitute codeword has a size different from the size of the nominal code word.

According to embodiments, said substitute codeword comprises a concatenation of said nominal codeword with a complementary bit sequence, said concatenation making said substitute codeword having a digital sum and/or an alternate sum that keeps the current running digital sum and/or the running alternate sum bounded.

Embodiments make it possible to generate an encoded bitstream which is "DC free" and "Nyquist free" while providing error correction with a variable coding rate.

According to embodiments an input bitstream is encoded using codewords of an error-control code (ECC) like a Hamming code codewords with codewords having a non-null digital sum (DS) and/or non-null alternate sum (AS) are concatenated with a bit sequence that is complementary to the codewords. Thus, the running digital sum (RDS) and/or the running alternate sum (RAS) of the encoded bitstream are kept null.

Embodiments thus use an extended Hamming coding and create a new code that has a variable coding rate.

For example, the extended Hamming code provides sixteen codewords with twelve of them having a null DS and twelve of them have null AS. Embodiments make it possible to keep the DS and AS null for each codewords.

According to embodiments, the decoding is a classical Hamming decoding for the error correction and a new process is performed just after in order to take into account the potential concatenation of a bit sequence to the extended Hamming codewords.

Embodiments provide better bit error rates (BER).

Also, the codewords used have null AS and null DS thereby providing DC-free and Nyquist-free encoded bitstreams.

Embodiments can be implemented in a non-complex fashion at encoders and decoders.

According to embodiments, said nominal codeword is determined according to a codebook of said error-control code and wherein said complementary bit sequence is a codeword of said codebook.

This makes it possible for the decoder to identify the codewords that have been concatenated in order to choose one of them for the decoding and then recover the decoded data.

According to a second aspect of the invention there is provided a method comprising:
  performing a first encoding according to the first aspect with said substitute codeword having a same size as the nominal codeword, and
  performing a second encoding according to the first aspect with said substitute codeword having a size different from the size of the nominal code word, the input word for said second encoding being based on the encoded word encoded by said first encoding.

According to a third aspect of the invention there is provided a method comprising:
  performing a first encoding according to the first aspect with said substitute codeword having a size different from the size of the nominal code word, and
  performing a second encoding according to the first aspect with said substitute codeword having a same size as the nominal codeword, the input word for said second encoding being based on the encoded word encoded by said first encoding.

For example, in the methods according to the second and/or third aspects the input word for said second encoding is a result of an interleaving process on encoded words encoded by said first encoding.

According to a fourth aspect of the invention there is provided a method comprising determining a quality level of at least one communication link between a transmitter and at least one receiver and performing an encoding:
  according the first aspect with said substitute codeword having a same size as the nominal codeword or
  an encoding according to the first aspect with said substitute codeword having a size different from the size of the nominal code word
  based on said quality level and wherein said encoding is performed in view of transmitting the encoded bitstream form said transmitter to said at least one receiver.

For example, determining said quality level comprises determining a signal to noise ratio.

According to a fifth aspect of the invention there is provided a method of decoding a bitstream comprising:
  obtaining at least one current input encoded word of the bitstream to decode,
  determining whether said encoded word comprises a nominal codeword of an error-control code or a substitute codeword, and
  depending on the determination:
    outputting a decoded word by association of said nominal codeword with a decoded word according to said error-control code, or
    outputting a decoded word by computation based on said substitute codeword.

For example, said substitute codeword kept a current running digital sum and/or a running alternate sum bounded during encoding of the encoded word.

According to embodiments, the error-control code is a Hamming code.

For example, said determining step comprises computing a syndrome parameter.

For example, the presence of a substitute codeword is signalled in the bitstream.

According to embodiments, the method further comprises checking a parity bit code in said encoded word, said parity bit code being indicative of whether the encoded word comprises a nominal codeword or a substitute codeword.

For example, said substitute codeword has a same size as the nominal codeword.

According to embodiments, said substitute codeword has a size different from the size of the nominal code word.

For example, said substitute codeword comprises a concatenation of said nominal codeword with a complementary bit sequence, said concatenation making said substitute codeword having a digital sum and/or an alternate sum that kept a current running digital sum and/or the running alternate sum bounded during encoding of the encoded word.

According to embodiments, said nominal codeword is belongs to a codebook of said error-control code and said complementary bit sequence is a codeword of said codebook.

For example, the method further comprises a deinterleaving on the encoded word.

According to a sixth aspect of the invention, there is provided a device configured to implement a method according to any one of the first, second, third, fourth and fifth aspects of the invention.

According to a seventh aspect of the invention, there is provided a system comprising a plurality of devices configured to implement a method according to any one of the first, second, third, fourth and fifth aspects of the invention.

In particular, the system may comprise decoders for decoding the coded words.

According to an eighth aspect of the invention there are provided computer programs and computer program products comprising instructions for implementing methods according to any one of the first, second, third and fourth aspect of the invention, when loaded and executed on computer means of a programmable apparatus.

The objects according to the second to eighth aspects of the invention provide at least the same advantages as those provided by the method according to the first aspect.

BRIEF DESCRIPTION OF THE DRAWINGS

Features and advantages of the invention will become apparent from the following description of non-limiting exemplary embodiments, with reference to the appended drawings, in which:

FIG. 9 schematically illustrates an Extended Hamming encoding table with RDS and RAS values;

FIG. 10 schematically illustrates an encoding table according to embodiments;

DETAILED DESCRIPTION OF THE INVENTION

Figure 1:
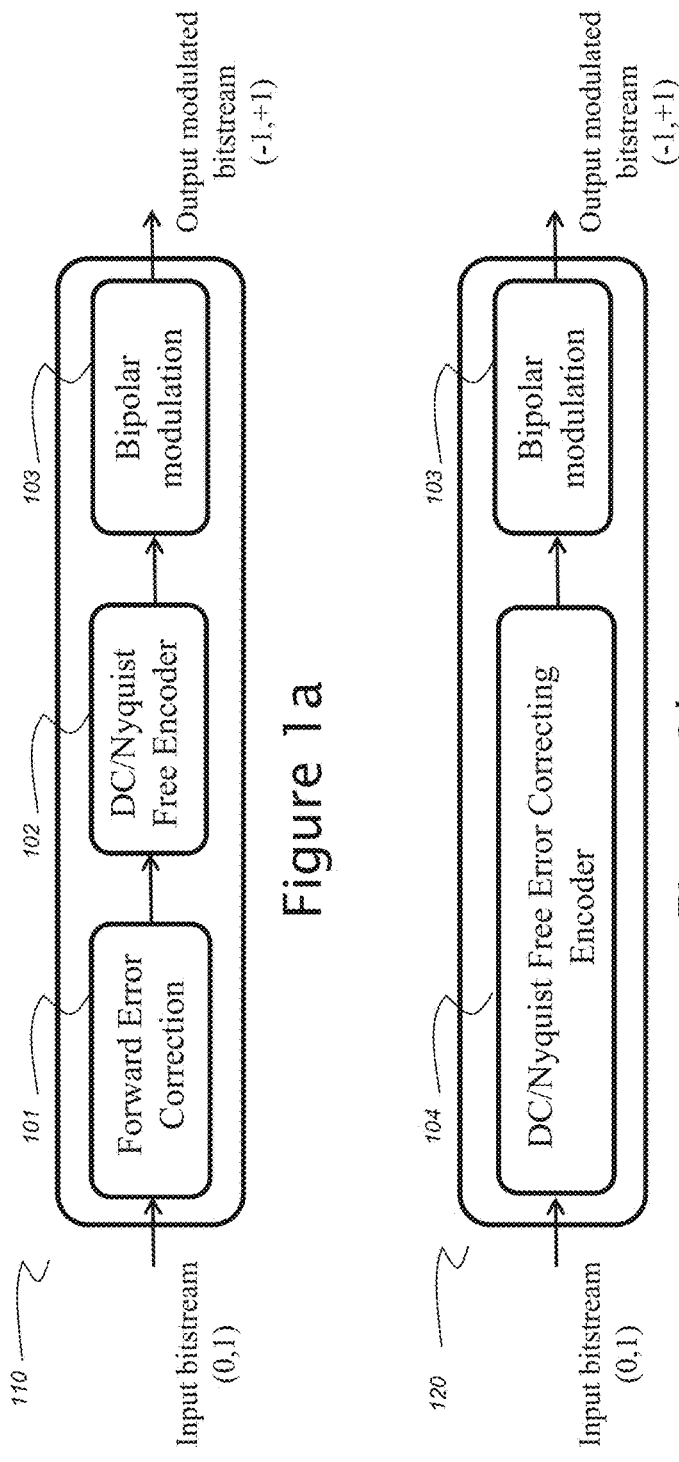
FIG. 1a schematically illustrates a prior art encoder architecture.
FIG. 1b schematically illustrates an encoder architecture according to embodiments.

Simple modulation and coding schemes (MCS) are desirable for ultra-high speed communications. The complexity must be as low as possible in order to have an efficient implementation. Some MCS already used in high speed wire communications can be used in terahertz communications like BPSK or OOK. In addition to the modulation, some line coding, known in wired communications, can be implemented in order to shape the spectrum. Line coding techniques like 8B10B, 64B66B, and MB810 can be used. These techniques can be implemented in PCI express, Gigabit Ethernet, DVI, HDMI and many other standards. A line code is implemented in order to shape the spectrum into the communication medium. For example, the 8B10B line coding is used for removing the DC components so that the spectrum of the bitstream has a null component (no power) at the null frequency.

A DC free bitstream (i.e. a bitstream without continuous component) is desirable since the null frequency is generally filtered by the decoupling capacitors that are used between the different stages of the transceivers (filters, amplifiers etc.).

According to embodiments, a DC free and Nyquist free line code is built from the extended Hamming code, the resulting code having constant coding rate. The extended Hamming code provides sixteen codewords with twelve of them having a null RDS and twelve others having null RAS. A modification of the encoding process makes it possible to control the RDS and RAS over a given bitstream. The decoder applies the classical Hamming decoding for performing the error correction.

The DC free line code is obtained when the line code generates a bounded value for the Running Digital Sum (RDS). The lower the value of the RDS boundary, the lower the power of the spectrum at the null frequency. The best DC free codes have null RDS.

A Nyquist free line code (considered as a minimum bandwidth code) is also very interesting for ultra-high speed communications because it has a spectrum which shows a null component at the Nyquist frequency. Then, a Nyquist free line code releases the constraints on the design of filters, equalizers, etc. and improves the quality of the transmission on limited bandwidth channels.

The Nyquist free line code is obtained when the line code generates a bounded value for the Running Alternate Sum (RAS). In order to have a low power of the spectrum at the Nyquist frequency, the value of the RAS must be bounded by a value as low as possible. The best Nyquist free codes have null RAS.

Typically, line codes are followed by an error correction code (ECC) while the line code is designed to match the channel and the ECC is designed to correct the errors caused by the channel or even in detection.

Unfortunately, an error sequence in the input of the modulation decoder may result in error propagation since modulation codes unlike ECC codes are nonlinear in nature.

Error propagation would result in overwhelming the error correcting capability of the ECC decoder and then decoder output may have erroneous bits.

Using a joint coding for modulation and error correction would enable the correction of many channel errors before reaching to the modulation decoder, and therefore the chance of error propagation would be decreased.

FIG. 1a illustrates an encoder with Forward Error Correction and DC/Nyquist free block coding. The encoder of FIG. 1a has a classical architecture.

The encoder 110 comprises a Forward Error Correction module 101 concatenated with a DC/Nyquist free block coding module 102. For example, the block coding is 8B10B, MB810 or the like. The Forward Error Correction module may use any known code.

For the case of a convolutional code, a table containing some possible convolutional codes with the optimum constraint length having coding rates equal to ½ and ⅓ may be found in document B. Sklar, "Digital Communications: Fundamentals and Applications", Prentice Hall 2001, ISBN: 0-13-084788-7. Any one of the codes listed in table 7.4 in this document can be used.

This document gives some FEC examples: BCH, Reed-Solomon, Convolutional codes, LDPC (Low Density Parity Check Code). All these codes can be used for Forward Error Correction.

The encoder further comprises a bipolar modulation unit 103 wherein the bits are converted into positive or negative integers (+1 and −1). Zeroes "0" are coded with "+1" and ones "1" are coded with "−1".

FIG. 1b illustrates an encoder 120 according to embodiments. The encoder comprises a module 104 configured to perform encoding that generates a bitstream which is DC free (no continuous component) and Nyquist free (no component at half the sampling frequency) and that includes parity bits.

In what follows, coding schemes with fixed coding rate and with variable coding rate are described. Encoding with fixed coding rate is described with reference to FIGS. 2 to 8. Encoding with variable coding rate is described with reference to FIGS. 9 to 14. Combinations of the two types of coding schemes are described with reference to FIGS. 15 and 16.

Figure 2:
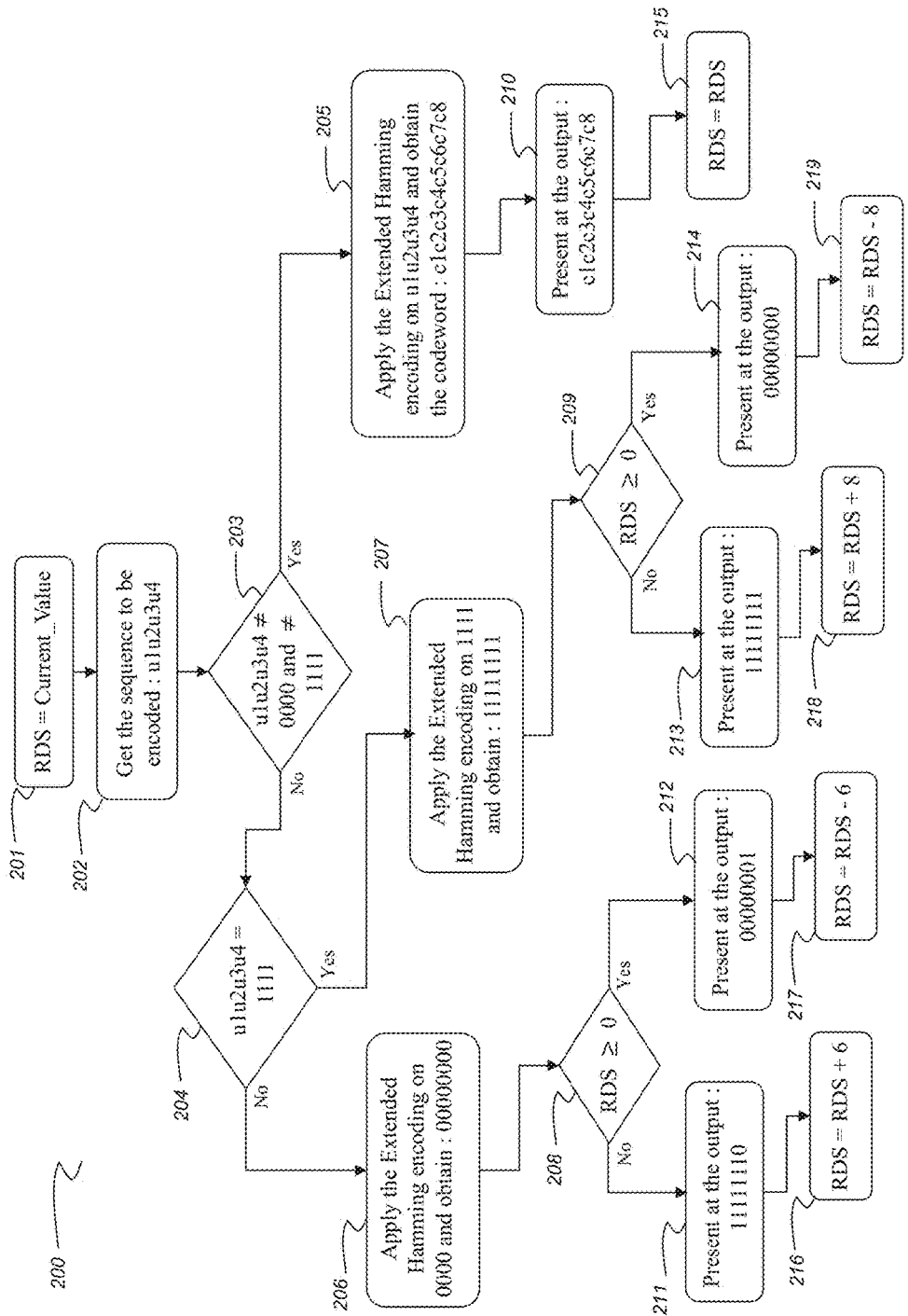
FIG. 2 is a flowchart of steps of an encoding algorithm with Forward Error Correction and DC free block coding according to embodiments.

FIG. 2 is a flowchart of steps of an encoding 200 with Forward Error Correction and DC free block coding according to embodiments.

Encoding is performed with balancing of the running digital sum. The initial running digital sum is initialized to the current value in step 201 before encoding the four input bit sequence "u1u2u3u4" obtained during step 202. If the input sequence is different from the sequences "0000" and "1111", then a Hamming encoding is carried out during step 205. The encoding is performed by applying the following Hamming generator matrix (4 bits input, 7 bits output):

$$G = \begin{matrix} 1 & 1 & 0 & 1 \\ 1 & 0 & 1 & 1 \\ 1 & 0 & 0 & 0 \\ 0 & 1 & 1 & 1 \\ 0 & 1 & 0 & 0 \\ 0 & 0 & 1 & 0 \\ 0 & 0 & 0 & 1 \end{matrix}$$

The corresponding parity check matrix is:

$$H = \begin{matrix} 0 & 0 & 0 & 1 & 1 & 1 & 1 \\ 0 & 1 & 1 & 0 & 0 & 1 & 1 \\ 1 & 0 & 1 & 0 & 1 & 0 & 1 \end{matrix}$$

A parity bit is added to the 7 bits outputted in order to obtain an 8 bits sequence having a null digital sum and a null alternate sum.

Let's consider the following exemplary extended Hamming encoding of the input sequence u1u2u3u4=0001. The extended Hamming encoding is performed in two steps:

the 7 bits of the Hamming code are computed by applying the matrix G: $(c1c2c3c4c5c6c7)^t = G*(u1u2u3u4)^t = (1101001)^t$ next, the parity bit c8 is computed on the codeword (c1 c2c3c4c5c6c7): $(c1\ c2c3c4c5c6c7c8)^t = (11010010)^t$ When the codeword is obtained, an update of the Running Digital Sum is carried out in step 215. Since the Digital Sum of the codeword obtained in step 210 is null, the Running Digital Sum remains the same (RDS=RDS).

During steps 203 and 204 it is checked whether the input word is equal to "0000" or "1111".

When the input sequence is equal to "0000", the extended Hamming code is applied during step 206 in order to obtain an output sequence equal to "00000000". If the RDS is positive, the encoder outputs a sequence equal to "00000001" during step 212. The Running Digital Sum is updated in step 217 according to RDS=RDS−6 because the digital sum of "00000001" is equal to "−6". When the RDS value is determined to be negative during test 208, the encoder outputs a sequence equal to "11111110" and the RDS is updated during step 216 according to RDS=RDS+6 because the digital sum of "11111110" is equal to "6".

When the input sequence is equal to "1111", the extended Hamming code is applied during step 207 in order to obtain an output equal to "11111111". If the RDS is positive, the encoder outputs a sequence equal to "00000000" during step 214. The Running Digital Sum is updated in step 219 according to RDS=RDS−8 because the digital sum of "00000000" is equal to "−8". When the RDS value is determined to be negative during test 209, the encoder outputs a sequence equal to "11111111" and the RDS is updated during step 218 according to RDS=RDS+8 because the digital sum of "11111111" is equal to "8".

Figure 3:
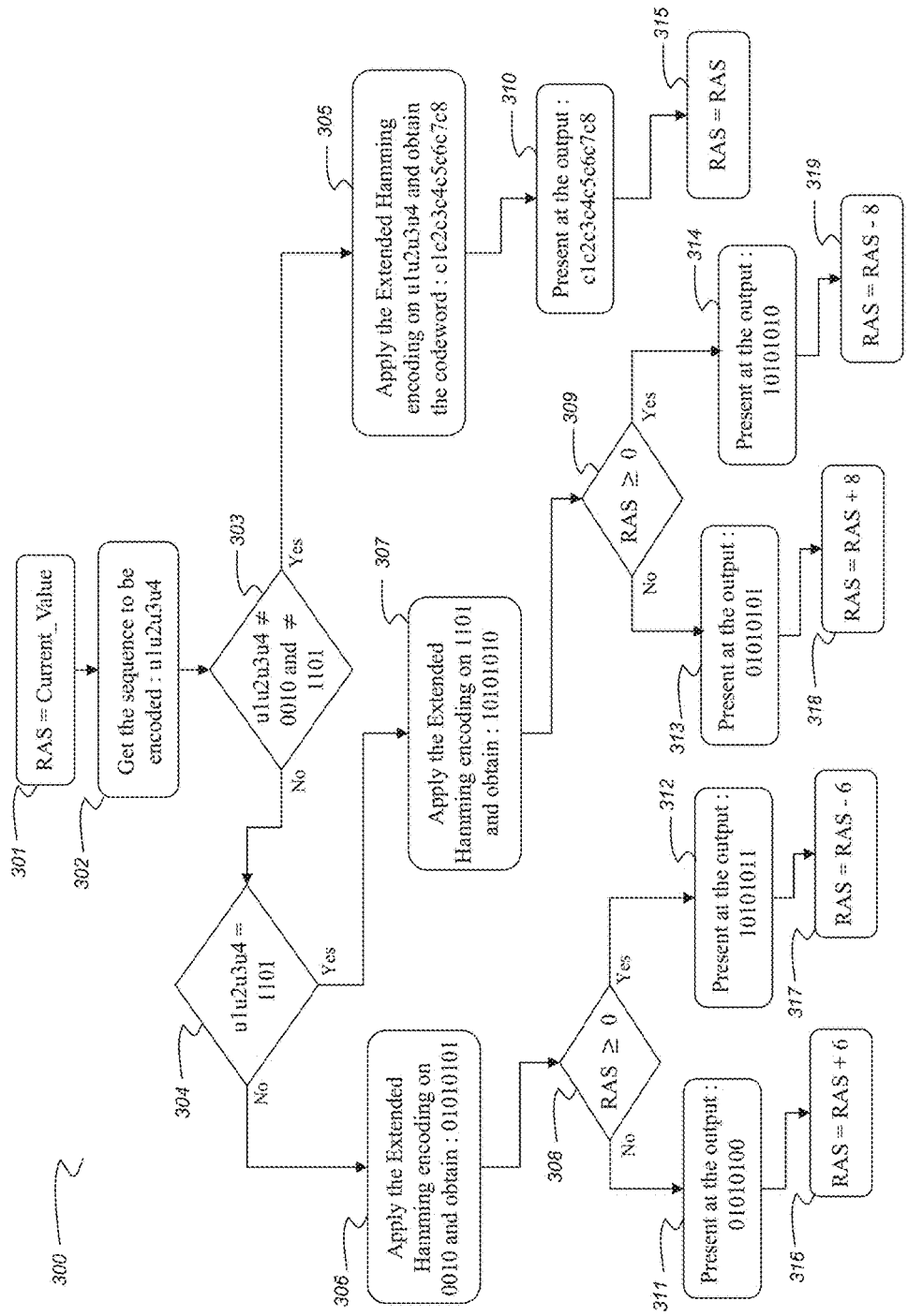
FIG. 3 is a flowchart of steps of an encoding algorithm with Forward Error Correction and Nyquist free block coding according to embodiments.

FIG. 3 is a flowchart of steps of an encoding 300 with Forward Error Correction and Nyquist free block coding according to embodiments.

In the algorithm of FIG. 3, encoding is performed with balancing of the alternate digital sum. The initial alternate digital sum is initialized to the current value in step 301 before encoding the four bits input sequence "u1u2u3u4" received during step 302. If the input sequence is different from the sequences "0010" and "1101", a Hamming encoding is carried out during step 305. The encoding is performed by applying the following Hamming generator matrix (4 bits input, 7 bits output):

$$G = \begin{pmatrix} 1 & 1 & 0 & 1 \\ 1 & 0 & 1 & 1 \\ 1 & 0 & 0 & 0 \\ 0 & 1 & 1 & 1 \\ 0 & 1 & 0 & 0 \\ 0 & 0 & 1 & 0 \\ 0 & 0 & 0 & 1 \end{pmatrix}$$

The corresponding parity check matrix is:

$$H = \begin{pmatrix} 0 & 0 & 0 & 1 & 1 & 1 & 1 \\ 0 & 1 & 1 & 0 & 0 & 1 & 1 \\ 1 & 0 & 1 & 0 & 1 & 0 & 1 \end{pmatrix}$$

A parity bit is added to the 7 bits sequence outputted in order to obtain an 8 bits sequence having a null digital sum and a null alternate sum.

When the codeword is obtained, an update of the Alternate Digital Sum is carried out during step 315. Since the Alternate Sum of the codeword obtained in step 310 is null, the Running Alternate Sum remains the same (RAS =RAS).

During steps 303 and 304, it is checked whether the input word is equal to "0010" or "1101".

When the input sequence is equal to "0010", the extended Hamming code is carried out during step 306 in order to obtain an output sequence to "01010101". If the RAS is positive, the encoder outputs a sequence equal to "10101011" during step 312. Next, the Running Alternate Sum is updated during step 317 according to RAS=RAS−6 because the alternate sum of "10101011" is equal to "−6". When the RAS value is determined to be negative during step 308, the encoder outputs a sequence equal to "01010100" and the RAS is updated during step 316 according to RAS=RAS+6 because the alternate sum of "01010100" is equal to "6".

When the input sequence is equal to "1101", the extended Hamming code is carried out during step 307 in order to obtain an output equal to "10101010". If the RAS is positive, the encoder outputs a sequence equal to "10101010" during step 314. Next, the running alternate sum is updated during step 319 according to RAS=RAS−8 because the digital sum of "10101010" is equal to "−8". When the RAS value is determined to be negative during step 309, the encoder outputs a sequence equal to "01010101" and the RAS is updated during step 318 according to RAS=RAS+8 because the digital sum of "01010101" is equal to "8".

Figure 4:
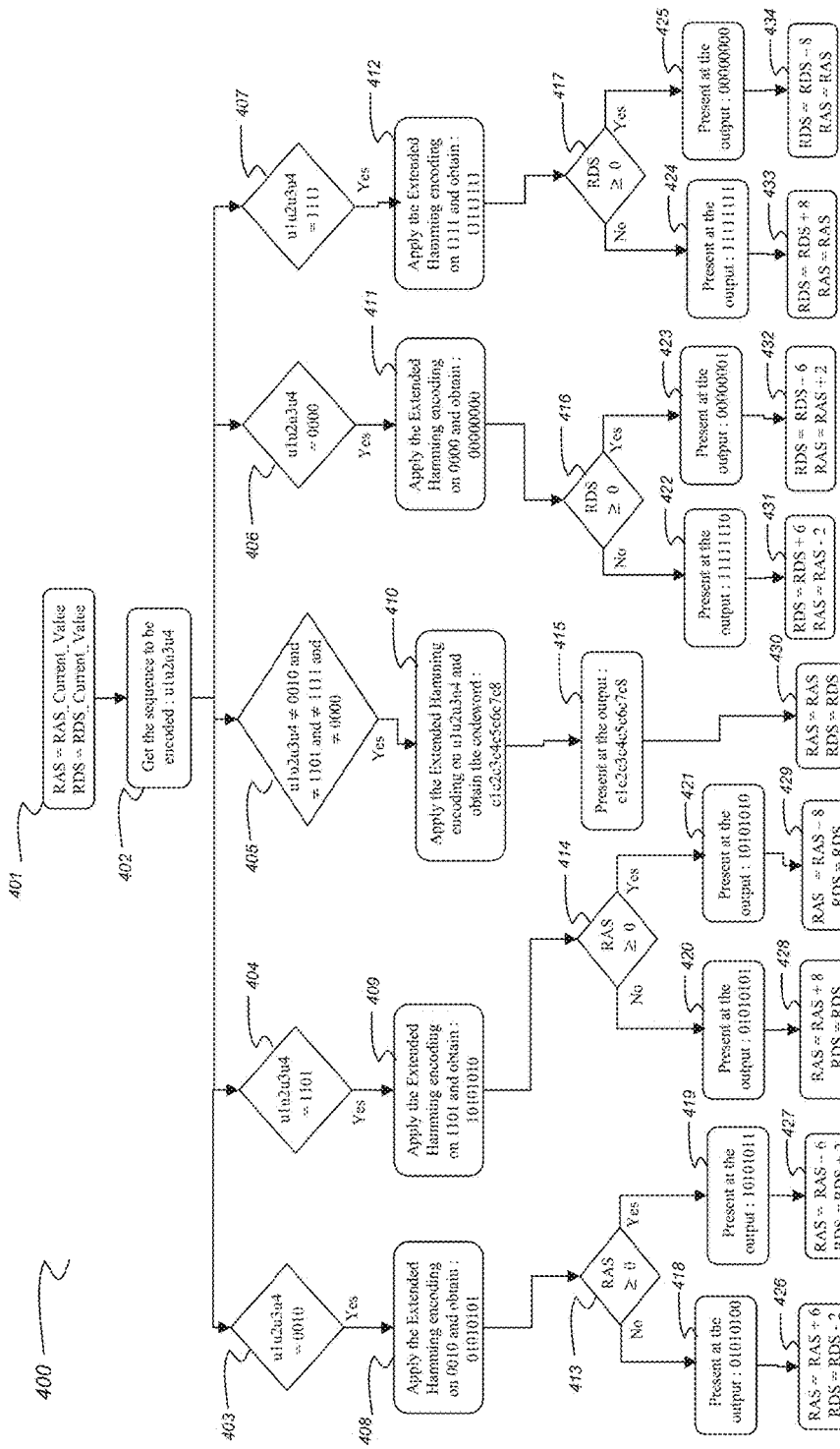
FIG. 4 is a flowchart of steps of an encoding algorithm with Forward Error Correction, DC free block coding and Nyquist free block coding according to embodiments.

FIG. 4 is a flowchart of steps of an encoding 400 with forward error correction and both free DC and free Nyquist block coding.

The steps in FIG. 4 make it possible to obtain a DC free and Nyquist free encoded bitstream.

Encoding 400 comprises performing encoding 200 of FIG. 2 and encoding 300 of FIG. 3 in parallel. Thus, the RDS and the RAS are controlled simultaneously.

The running digital sum and the running alternate sum are jointly updated when encoding sequences "0010" and "0000".

The encoding of the sequence "0010" provides either the "01010100" sequence or the "10101011" sequence. The RAS and the RDS of these two sequences are not null. Therefore, these two parameters are updated during respective steps 426 and 427 according to RAS=RAS+6 and RDS=RDS−2 for sequence "01010100" and according to RAS=RAS−6 and RDS=RDS+2 for sequence "10101011".

Encoding sequence "0000" provides either sequence "00000001" or sequence "11111110". The RAS and the RDS of these two sequences are not null. Therefore, these two parameters are updated during respective steps 431 and 432 according to RDS=RDS+6 and RAS=RAS−2 for sequence "11111110" and according to RDS=RDS−6 and RAS=RAS+2 for sequence "00000001".

Step 401 basically corresponds to steps 201 and 301. The initial running digital sum is initialized to the current value and the initial alternate digital sum is initialized to the current value.

Step 402 basically corresponds to steps 202 and 203. The four input bit sequence "u1 u2u3u4" is received.

Next, the process goes through five branches wherein tests 403, 404, 405, 406 and 407 are performed in parallel.

Test 403 corresponds to the combination of the tests of steps 303 and 304. It is determined whether the input sequence is "0010".

Test 404 corresponds to the test of step 304. It is determined whether the input sequence is "1101".

Test 405 corresponds to the combination of the tests of steps 203 and 303. It is determined whether the input sequence is different from "0010", "1101", "1111" and "0000".

Test 406 corresponds to the combination of the tests of steps 203 and 204. It is determined whether the input sequence is "0000".

Test 407 corresponds to the test of step 204. It is determined whether the input sequence is "1111".

In case test 403 is positive (yes), steps 408, 413, 418 and 419 are performed that basically correspond to steps 306, 308, 311 and 312. After step 418 is performed, the RAS is updated in step 426 according to RAS=RAS+6 (which corresponds to step 316) and the RDS is also updated in step 427 according to RDS=RDS−2 as discussed hereinabove. Also, after step 419 is performed, the RAS is updated according to RAS=RAS−6 (which corresponds to step 317) and the RDS is also updated according to RDS=RDS+2 as discussed hereinabove.

In case test 304404 is positive (yes), steps 409, 414, 420 and 421 are performed that basically correspond to steps 307, 309, 313 and 314. After step 420 is performed, the RAS is updated in step 428 according to RAS=RAS+8 (which corresponds to step 318) and the RDS is kept as it stands (RDS=RDS) as discussed hereinabove. Also, after step 421 is performed, the RAS is updated in step 429 according to RAS=RAS−8 (which corresponds to step 319) and the RDS is kept as it stands (RDS=RDS) as discussed hereinabove.

In case test 405 is positive (yes), a step 410 (corresponding to steps 205 and 305), a step 415 (corresponding to steps 210 and 310) and a step 430 (corresponding to steps 215 and 315) are performed.

In case test 406 is positive (yes), steps 411, 416, 422 and 423 are performed that basically correspond to steps 206, 208, 211 and 212. After step 422 is performed, the RDS is updated in step 431 according to RDS=RDS+6 (which corresponds to step 216) and the RAS is also updated in step 432 according to RAS=RAS−2 as discussed hereinabove. Also, after step 423 is performed, the RDS is updated according to RDS=RDS−6 (which corresponds to step 217) and the RAS is also updated according to RAS=RAS +2 as discussed hereinabove.

In case test 407 is positive (yes), steps 412, 417, 424 and 425 are performed that basically correspond to steps 207, 209, 213 and 214. After step 424 is performed, the RDS is updated in step 433 according to RDS=RDS+8 (which corresponds to step 218) and the RAS is kept as it stands (RAS=RAS) as discussed hereinabove. Also, after step 425 is performed, the RDS is updated in step 434 according to RDS=RDS−8 (which corresponds to step 219) and the RAS is kept as it stands (RAS=RAS) as discussed hereinabove.

Figure 5:
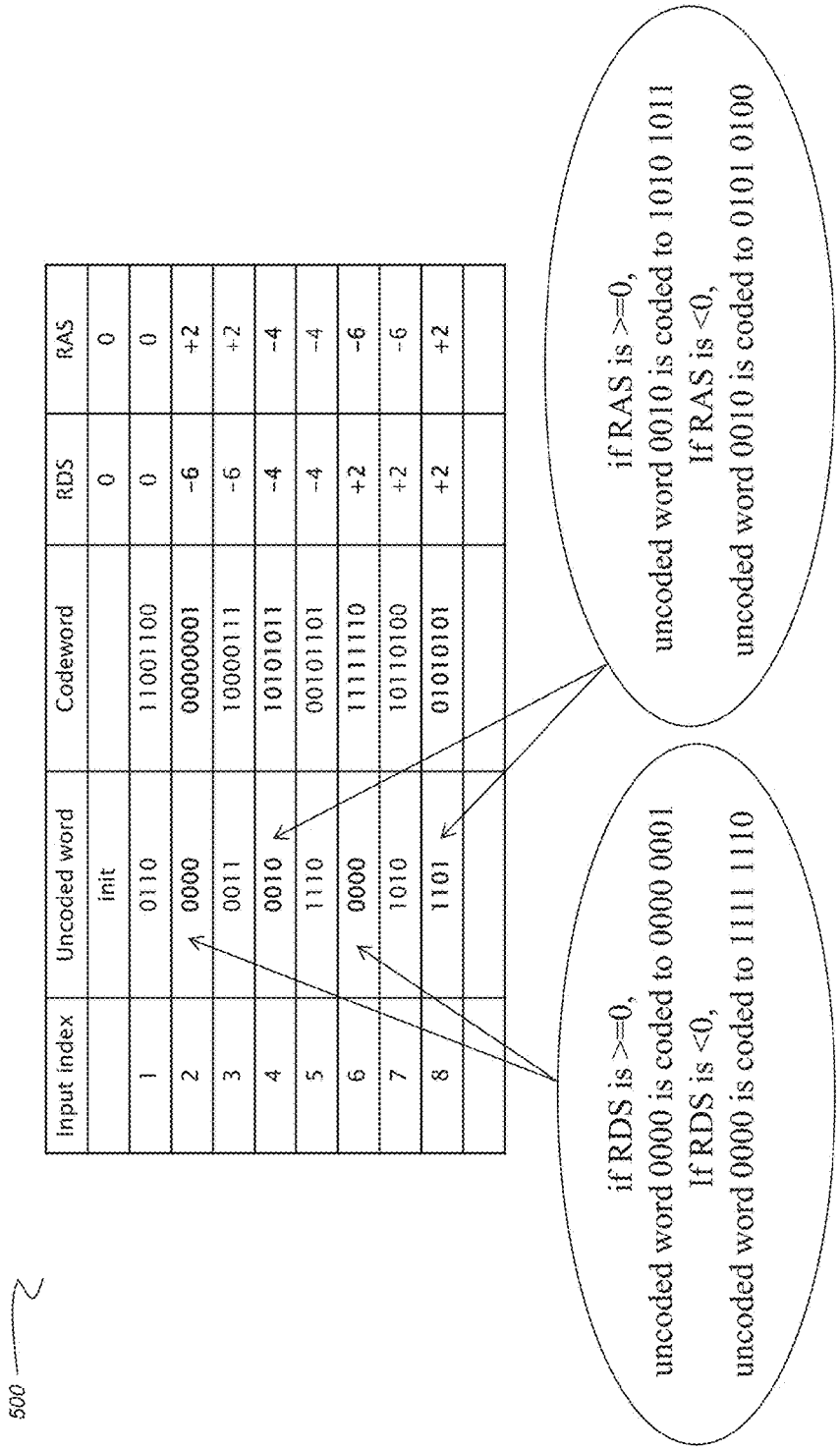
FIG. 5 schematically illustrates encoding of an exemplary arbitrary bitstream.

FIG. 5 illustrates the encoding on an exemplary arbitrary bitstream according to embodiments. The DC free and Nyquist free encoding of FIG. 4 is carried out.

FIG. 5 shows a table with input sequences of the bitstream in the second column "uncoded word". The encoded bits are presented in the third column "Codeword". The fourth column comprises the RDS values and the fifth column comprises the RAS values. The first column comprises the indexes of the input sequences.

The first line of the table corresponds to the initialization of the encoder (no sequence is received but the RDS and the RAS are initialized (to zero in the present example).

When the encoder receives the input sequence "0110" the output bit sequence is "11001100" and the RDS and the RAS values remain equal to zero.

When the encoder receives the next bit sequence to be encoded: "0000", the output encoded sequence is "00000001" and the RDS is updated to −6 and the RAS to +2.

When the encoder receives the next bit sequence to be encoded: "0011", the output encoded sequence is "10000111" and the RDS remains equal to −6 and the RAS to +2.

When the encoder receives the next bit sequence to be encoded: "0010", the output encoded sequence is "10101011" and the RDS is updated to −4 and the RAS to −4.

When the encoder receives the next bit sequence to be encoded: "1110", the output encoded sequence is "00101101" and the RDS remains equal to −4 and the RAS to −4.

When the encoder receives the next bit sequence to be encoded: "0000", the output encoded sequence is "11111110" and the RDS is updated to +2 and the RAS to −6.

When the encoder receives the next bit sequence to be encoded: "1010", the output encoded sequence is "10110100" and the RDS remains equal to +2 and the RAS to −6.

When the encoder receives the next bit sequence to be encoded: "1101", the output encoded sequence is "01010101" and the RDS is updated to +2 and the RAS to +2.

Figure 6:
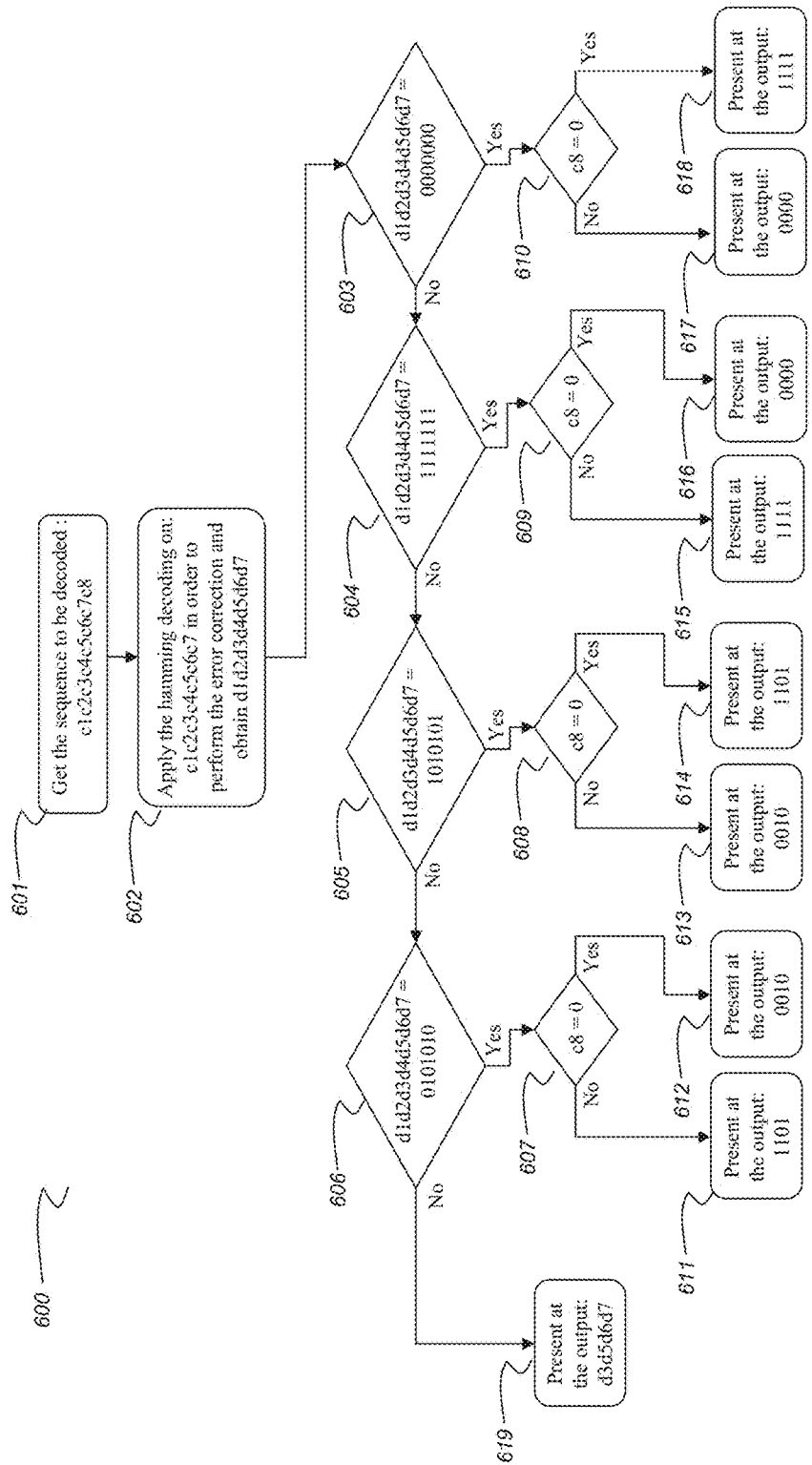
FIG. 6 is a flowchart of steps of a decoding algorithm according to embodiments.

FIG. 6 is a flowchart of steps of a decoding 600 according to embodiments.

After receiving the word "c1c2c3c4c5c6c7c8" in step 601, a Hamming decoding algorithm is carried out in step 602 in order to perform the error correction. An example of the Hamming decoding is described below for the following parity check matrix:

$$H = \begin{pmatrix} 0 & 0 & 0 & 1 & 1 & 1 & 1 \\ 0 & 1 & 1 & 0 & 0 & 1 & 1 \\ 1 & 0 & 1 & 0 & 1 & 0 & 1 \end{pmatrix}$$

The Syndrome is calculated by multiplying the parity check matrix of the Hamming code with the received word. If the syndrome is null, then the received word is a codeword and the uncoded word is extracted directly from the received word. If the Syndrome is not null, then one bit of the received word is inverted and the index of this bit is computed starting from the Syndrome as shown in the algorithm above.

```
Syn = H . [c1 c2 c3 c4 c5 c6 c7]';
if           Syn = [0 0 0]';
             u = [c(3) c(5) c(6) c(7)]';
else
             ind = Syn(3)+2*Syn(2)+4*Syn(1);
             c(ind) = not(ind);
             u = [c(3) c(5) c(6) c(7)]t;
end
```

After the Hamming decoding, a codeword d=d1d2d3d4d5d6d7 is obtained. During steps 603, 604, 605, 606 it is tested whether the word d is equal, respectively, to "0000000" or "1111111" or "1010101" or "0101010".

If d is equal to "0000000" (yes in step 603), then, depending on the value of c8, whether it is "0" or not (step 610), the output sequence is selected: "0000" (no) in step 617 or "1111" (yes) in step 618.

If d is equal to "1111111" (no in step 603 and then yes in step 604), then, depending on the value of c8, whether it is equal to "0" or not (step 609) the output sequence is selected: "0000" (yes) in step 616 or "1111" (no) in step 615.

If d is equal to "1010101" (no in step 604 and then yes in step 605), then, depending on the value of c8, whether it is equal to "0" or not (step 608) the output sequence is selected: "0010" (no) in step 613 or "1101" (yes) in step 614.

If d is equal to "0101010" (no in step 605 and then yes in step 606), then, depending on the value of c8, whether it is equal to "0" or not (step 607) the output sequence is selected: "1101" (no) in step 611 or "0010" (yes) in step 612.

Otherwise (no in step 606) sequence d3d5d6d7 is outputted in step 619.

Figure 7:
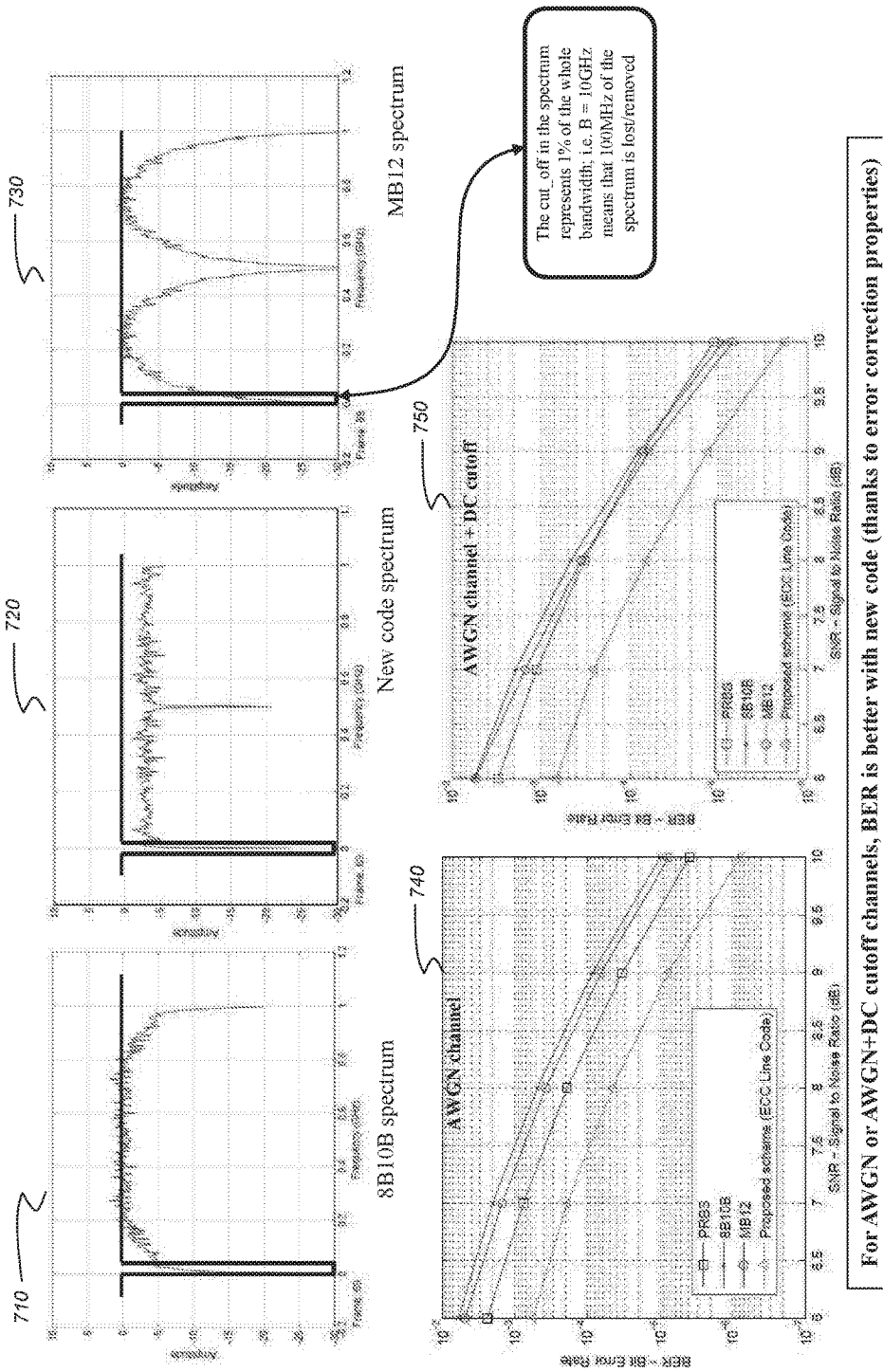
FIGS. 7-8 illustrate simulation results.

FIG. 7 illustrates simulation results when comparing a coding according to embodiments with prior art coding (the MB12 line code and the 8B10B line code). Additive white Gaussian noise (AWGN) and DC cut-off channels have been used.

Graph 710 represents the spectrum of the 8B10B line code (which is DC free) and graph 730 represents the spectrum of the MB12 line code (which is DC free and Nyquist free). The spectrum of the line code according to embodiments represented in graph 720 (the spectrum is thus DC free and Nyquist free). The DC cut-off (in bold line) was simulated by removing about 1% of the bandwidth starting from the null frequency (f=0 Hz). One can see from Gaph 720 that the spectrum of the bitstream obtained by the encoding process 400 is DC free and Nyquist free. Performance (as shown in Graph 720) in terms of DC cut-off is close to performance of the 8b10b (as shown in Graph 710).

Graph 740 shows the Bit Error Rate (BER) as a function of the Signal to Noise Ratio (SNR) in an AWGN channel when using an 8B10B line code (line with crosses), an MB12 line code (line with circles), a pseudo random binary stream (PRBS), i.e. a BPSK modulation without encoding (line with squares) and a coding according to embodiments (line with triangles).

As it appears from graph 740, coding according to embodiments provides better performance since the error correction makes the BER decrease.

Graph 750 shows the Bit Error Rate as a function of the Signal to Noise Ratio when using an AWGN channel plus DC cut-off. Here again, the coding according to embodiments has better performance.

Figure 8:
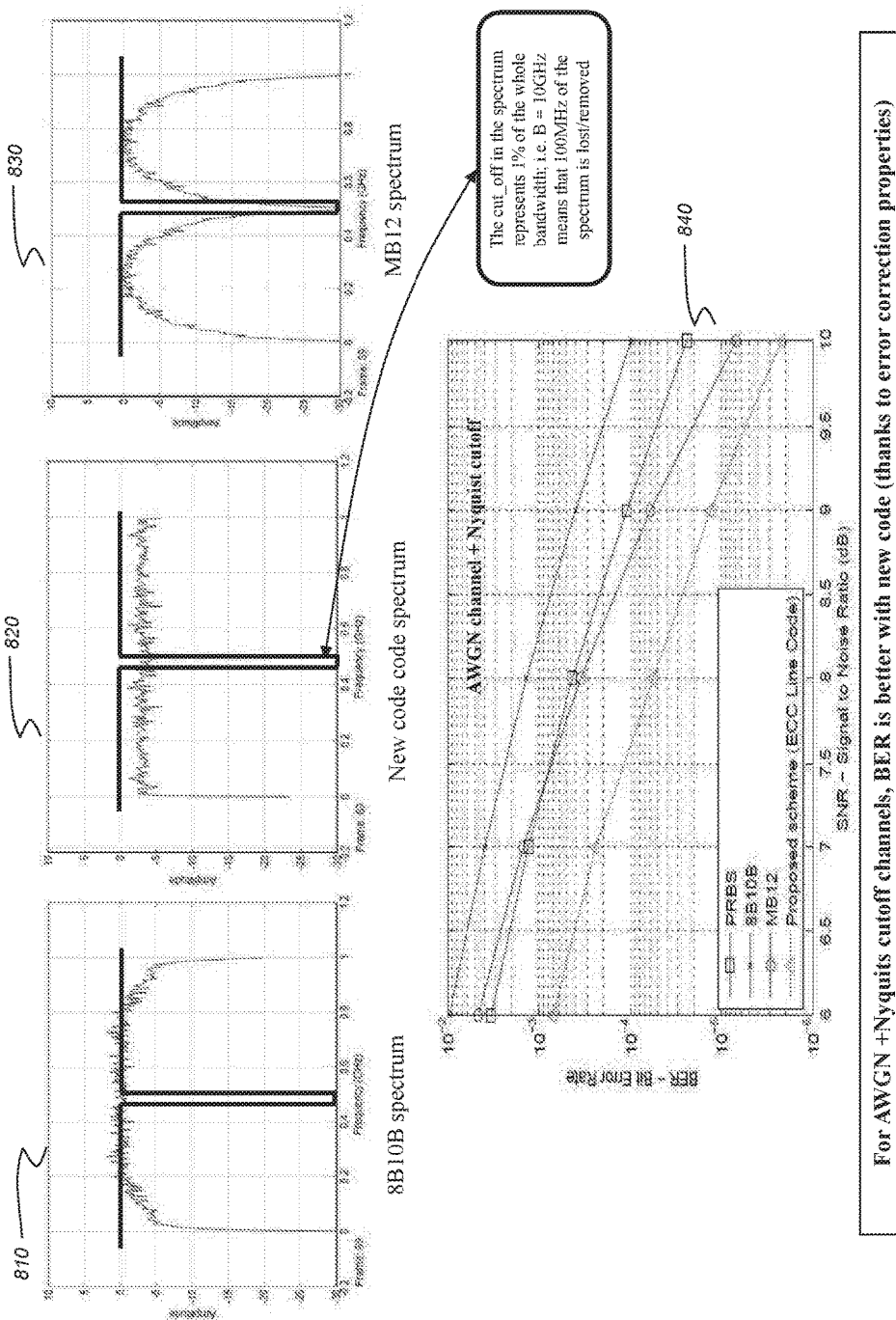

FIG. 8 illustrates simulation results when comparing a coding according to embodiments with prior art coding (the MB12 line code and the 8B10B line code). Additive white Gaussian noise (AWGN) and Nyquist Frequency cut-off channels have been used.

Graphs 810, 820 and 830 respectively show the spectra of the 8B10B coding, the coding according to embodiments and the MB12 coding. Each graph also shows the shape of the Nyquist cut-off channel (in bold line). One can see from Graph 720 that the Nyquist frequency cut-off is bad compared to the Nyquist frequency cut-off obtained with the MB12 coding (see graph 730). However, the error correction capability compensates for this drawback.

Graph 840 represents the Bit Error Rate as a function of the Signal to Noise Ratio. One can see that, even if the spectrum of the coding according to embodiments has more power around the Nyquist frequency when compared to the MB12 spectrum, the Bit Error Rate obtained is smaller than the Bit Error Rate obtained when using the MB12 line code (both line codes have the same coding rate).

In what follows, encoding with variable coding rate is described.

FIG. 9 schematically illustrates an Extended Hamming encoding table with DS and AS values. More details concerning such extended Hamming encoding have already been given hereinabove with reference to FIG. 2.

The encoding table is the same as the table discussed in the background section of the present description. Here, attention is drawn to the codewords which can lead to unlimited Running Digital Sum (RDS) and/or Running Alternate Sum (RAS) values.

Codewords "00000000" and "11111111" respectively have DS values equal to −8 and +8 whereas codewords "01010101" and "10101010" respectively have AS values equal to +8 and −8.

Therefore, a long line of uncoded words "0000" (resp. "1111") creates non null RDS and can lead to an RDS value which is not bounded as it will decrease (resp. increase) as the encoding goes on. With the encoding table of FIG. 9, the only way to limit the RDS value would be to control the number and position of words "0000" and "1111". However this is not possible since the words are source data input to the encoder.

The same reasoning applies to encoded word "0010" (resp. "1101") which has non-null RAS and which can lead to an RAS value which is not bounded.

FIG. 10 schematically illustrates an encoding table according to embodiments. This table is built from the Extended Hamming encoding table as follows:
  the codewords having a null Digital Sum and null Alternate sum are the same (no change, same relationship between the uncoded words and the codewords),
  for codewords having a non-null digital sum (DS) and/or non-null alternate sum (AS), the codeword is concatenated to a bit sequence that is complementary to the codeword so that the codeword thereby obtained has a null Digital Sum and a null Alternate sum. This makes it possible to maintain, respectively, the running digital sum (RDS) and/or the running alternate sum (RAS) of the stream of words null. Another variant could be to not systematically concatenate the complementary bit sequence to the sequence having a non-null digital sum and/or a non-null alternate sum. The complementary bit sequence could be added if the RDS or the RAS absolute values exceed a threshold. In this case, the running digital sum (RDS) and/or the running alternate sum (RAS) of the stream of words are kept bounded.

The words encoded with the classic Extended Hamming encoding table are encoded in 8 bits words and the words encoded with the concatenated words are encoded in 16 bits words.

Thus, the coding rate of the encoding book according to the present embodiments is variable. Assuming that the probability of occurrence of each uncoded word is the same for each uncoded word (i.e. 1/16, which can be achieved through scrambling of uncoded bits), the mean coding rate of the encoding book is 7/16 ((4*1/4+12*1/2)/16=7/16=0.4315).

It has to be noted that there is no ambiguity at the decoding because the concatenated codewords are distinct from the other codewords (a codeword with non-null DS/AS has a complementary with non-null DS/AS also, so both will be complemented).

Moreover, each half of the concatenated codeword is a codeword originally used in the Extended Hamming encoder which means that it can be decoded by the Extended Hamming decoder which will remove potential errors (as long as it is less than its error correction capacity) before to be processed by the decoder which decodes the concatenated codewords according to the present embodiments.

Figure 11:
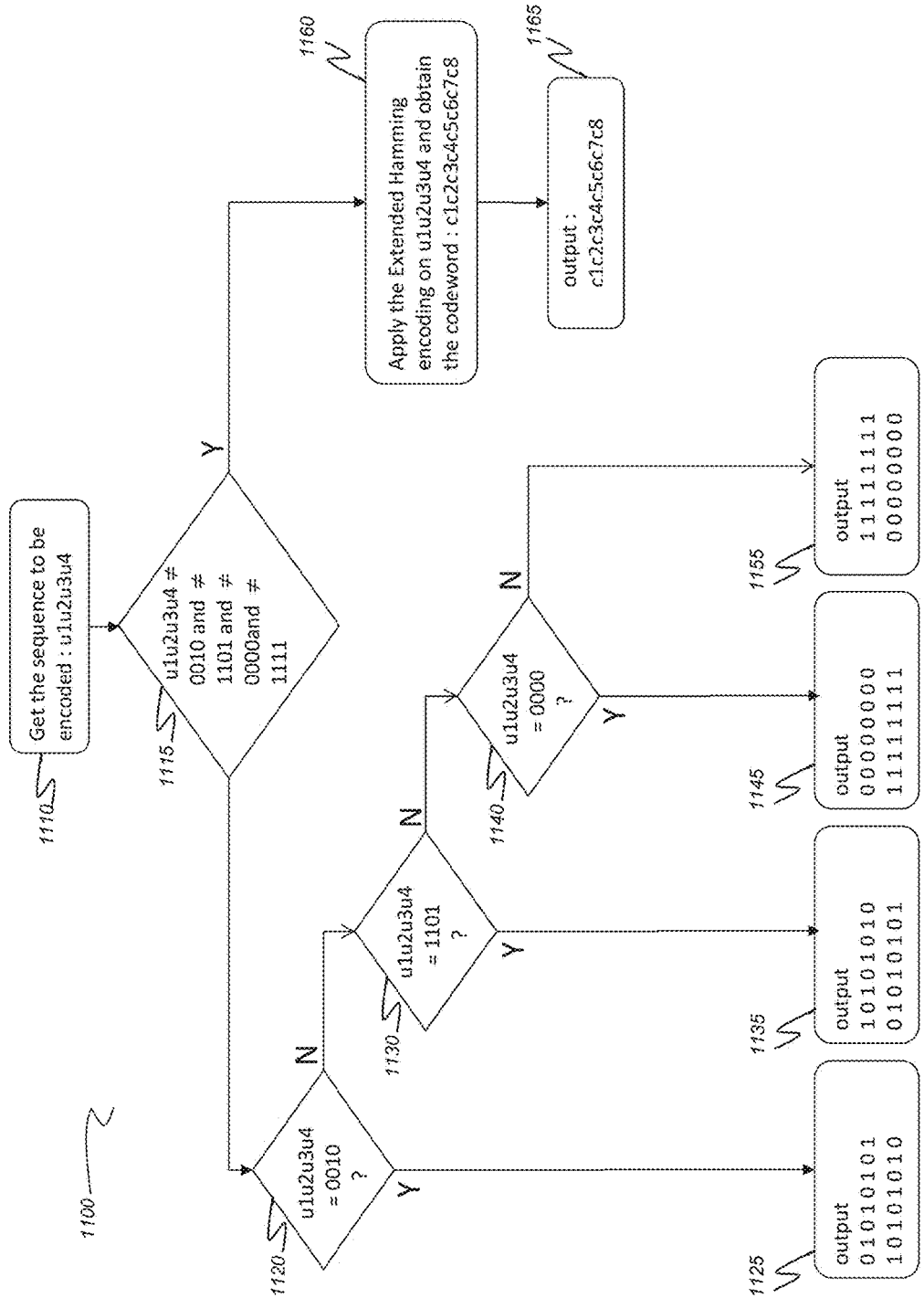
FIG. 11 is a flowchart of steps of an encoding according to embodiments.

FIG. 11 is a flowchart of steps of an encoding 1100 according to embodiments.

In a first step 1110, the input sequence "u1u2u3u4" (uncoded word) that is to be encoded is obtained. In the next step 1115, the value of the uncoded word is tested in order to check if it is equal to one of the four values '0010', '1101', '0000', '1111' (values which generate non null DS or AS).

In case the uncoded word is different from these values (Y), it is encoded in step 1160 using the Extended Hamming codebook. During the next step 1165, the codeword 'c1c2c3c4c5c6c7c8' (corresponding to the uncoded word in the table) is outputted.

If the result of test 1115 is positive (N), during the next step 1120, the value of the uncoded word is tested in order to check if it is equal to the value '0010'. If the result of the test is positive (Y), in the next step 1125, the codeword '0101010110101010' (corresponding to "0010" in the table) is outputted.

If the result of test 1120 is negative (N), during the next step 1130, the value of the uncoded word is tested in order to check if it is equal to the value '1101'. If the result of the test is positive (Y), in the next step 1135, the codeword '1010101001010101' (corresponding to "1101" in the table) is outputted.

If the result of test 1130 is negative (N), during the next step 1140, the value of the uncoded word is tested in order to check if it is equal to the value '0000'. If the result of the test is positive (Y), in the next step 1135, the codeword '0000000011111111' (which corresponds to "0000" in the table) is outputted.

If the result of test 1140 is negative (N), in the next step 1155, the codeword "1111111100000000" (which corresponds to "1111" in the table) is outputted.

FIGS. 12*a* to 12*d* illustrate simulation results when comparing a coding according to embodiments with prior art coding (the MB12 line code and the 8B10B line code). Additive white Gaussian noise (AWGN) and DC cut-off channels have been used.

Figure 12C:
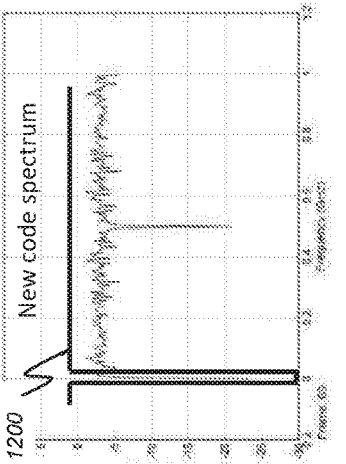
FIGS. 12a-12d and 13a-13d illustrate simulation results.
Figure 12B:
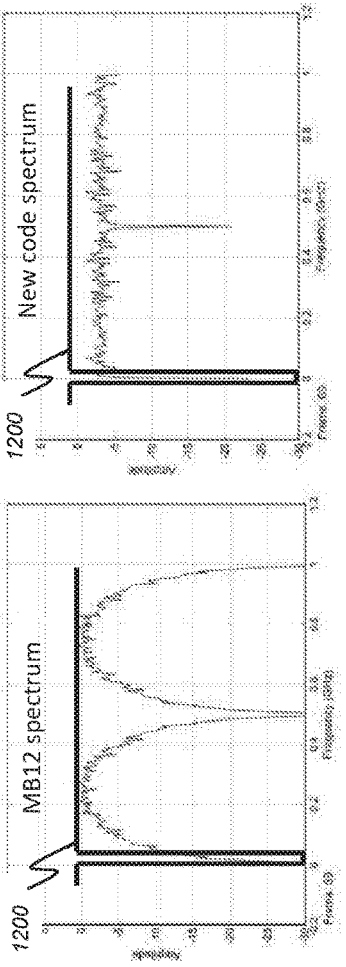
Figure 12D:
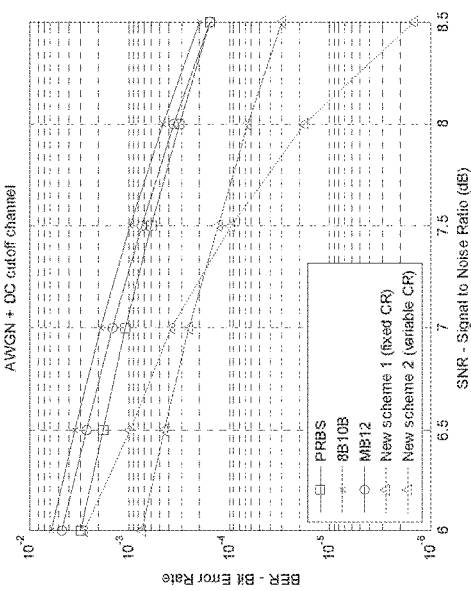
Figure 12A:
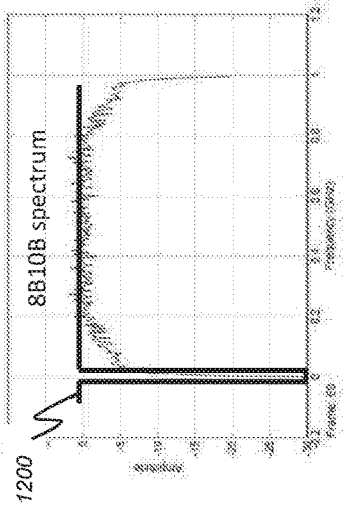

FIGS. 12a, 12b, 12c respectively show the spectrum of coded signals at the output of an 8b10b encoder, an MB12 encoder and an encoder with variable coding rate according to embodiments.

The pattern 1200 represents an example of what would be the bandwidth of a system wherein the null and close frequencies are filtered by the decoupling capacitors that are used between the different stages of the transceivers.

In the present example, the cut-off in the spectrum represents 1% of the whole bandwidth; i.e. B=10 GHz means that 100 MHz of the spectrum is lost/removed.

From FIGS. 12a and 12b, it can be noted that:
the energy of the "8b10b" encoded signal is very low inside the cut-off band but slightly attenuated just after this band,
the energy of the "MB12" encoded signal is a little bit higher inside the cut-off band but slightly attenuated just after this band; the Nyquist-free property of the MB12 encoder is also illustrated as the energy at the Nyquist frequency (½ of the sampling frequency) is null.

FIG. 12c shows the spectrum of the encoder according to embodiments. It can be note that the energy of the signal is still very low at DC frequency but is globally higher in the cut-off band than the energy of the signal encoded with 8B10B and MB12 encoders. However, the spectrum is flatter than the 8B10B and MB12 spectra.

FIG. 12d shows the BER as a function of the SNR for simulations performed with the four coding schemes: PRBS (BPSK modulation without encoding), 8B10B, MB12, and the encoding schemes according to the present embodiments.

For SNR values greater than 8.5 dB, the PRBS/BPSK modulation gives the worst results because without coding, there is energy in the cut-off band and then the loss of that energy creates many errors.

The results obtained with the MB12 coding (the curve with the circles) are better than those obtained with the 8B10B encoder (curve with the crosses). This is due to its very low level of energy in the cut-off band.

The results obtained with the encoder according to embodiments with variable coding rate (curve with the triangles) are substantially better even though the signal has non-null energy in the cut-off band. This is made possible thanks to the error correction capability.

Hence, whatever the SNR level, the coding scheme with variable coding rate according to the present embodiments has improved the performance comparatively to the prior art coding schemes 8B10B, MB12 and the PRBS/BPSK modulation.

FIGS. 13a-13d illustrate simulation results when comparing a coding according to embodiments with prior art coding (the MB12 line code and the 8B10B line code). Additive white Gaussian noise (AWGN) and Nyquist Frequency cut-off channels have been used.

Figures 13A, 13B, 13C, 13D:
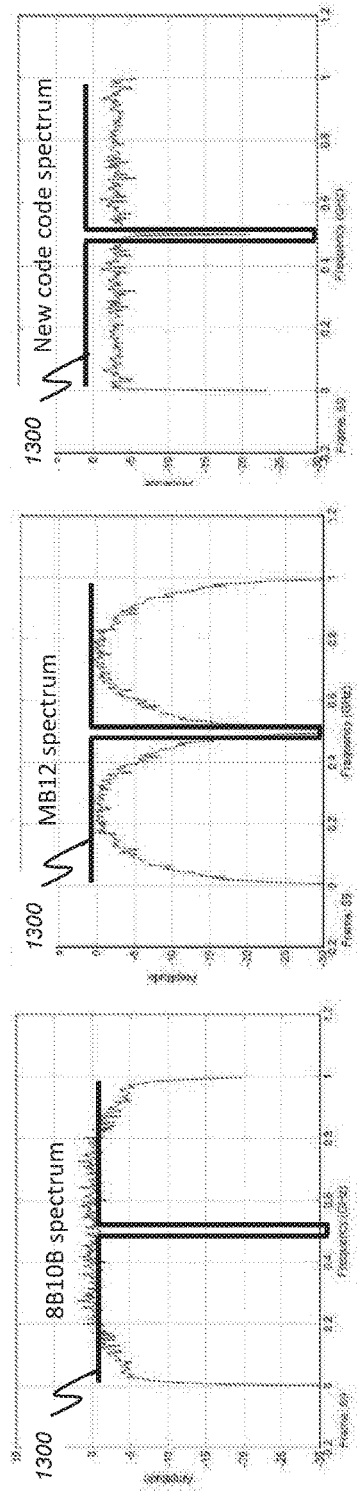

FIGS. 13a, 13b, 13c respectively show the spectrum of coded signals at the output of an 8B10B encoder, an MB12 encoder and an encoder with variable coding rate according to embodiments.

The pattern 1300 represents an example of what would be the bandwidth of a system wherein the Nyquist and close frequencies are filtered by the channel and/or parts of the transmitter/receiver.

In the present example, the cut-off in the spectrum represents 1% of the whole bandwidth; i.e. B=10 GHz means that 100 MHz of the spectrum is lost/removed.

From FIGS. 13a and 13b, it can be noted that:
the energy of the "8b10b" encoded signal is high inside the cut-off band because 8B10B is not a Nyquist-free code,
the energy of the "MB12" encoded signal is very low inside the cut-off band but slightly attenuated around this.

FIG. 13c shows the spectrum of a signal encoded by an encoder with variable coding rate according to embodiments. The energy of the signal is still very low at the Nyquist frequency but is globally higher in the cut-off band in comparison with the energy of the MB12 encoded signal. However, the spectrum is flatter than the 8B10B and MB12 spectra.

FIG. 13d shows the BER as a function of the SNR for simulations carried out with the four coding schemes: PRBS (BPSK modulation without encoding), 8B10B, MB12 and the coding scheme with fixed and variable coding rate according to the present embodiments.

The BPSK modulation gives the worst results since without coding, there is energy in the cut-off band and then the loss of that energy creates many errors.

The results obtained with MB12 coding (curve with circles) are better than those obtained with 8B10B coding (curve with crosses) because energy is very low in the cut off-band.

The results obtained with the encoding according of the present embodiments (curve with the triangles) are substantially better even though the encoded signal has non-null energy in the cut-off band. This is made possible thanks to its error correction capability.

Hence, whatever the SNR level, the coding scheme with variable coding rate according to the present embodiments has improved the performance comparatively to the prior art coding schemes 8B10B, MB12 and the PRBS/BPSK modulation.

Figure 14:
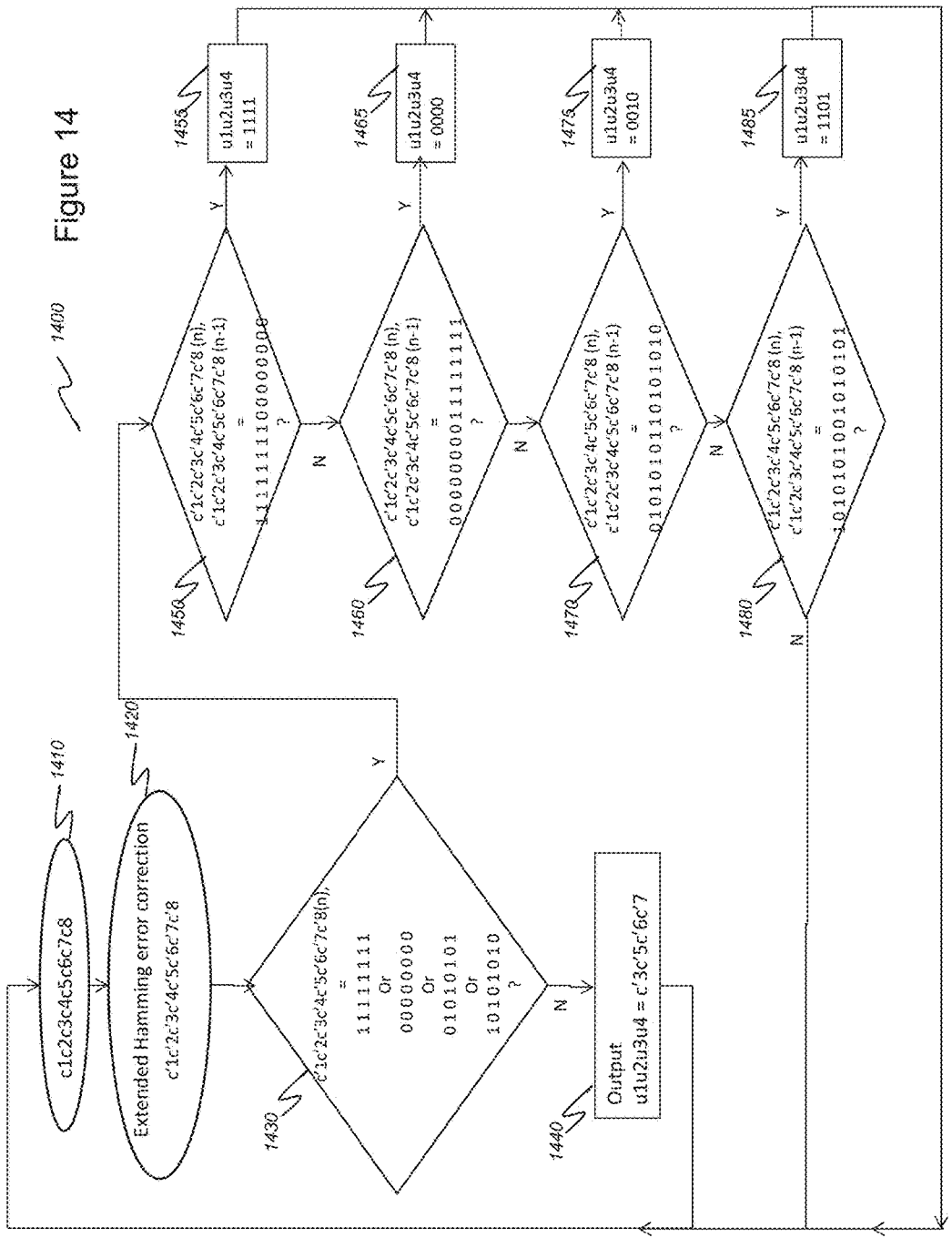
FIG. 14 is a flowchart of steps of a decoding according to embodiments.

FIG. 14 is a flowchart of steps of a decoding 1400 of a bitstream encoded with a variable coding rate according to embodiments.

Details concerning the Extended Hamming decoding algorithm have already been given with reference to FIG. 6 and will not be repeated here.

During a first step 1410, the encoded word c1c2c3c4c5c6c7c8 is obtained. In the next step 1420, a classical error correction matching the Extended Hamming code is carried out on the encoded word. The corrected word c'1c'2c'3c'4c'5c'6c'7c'8 is then processed in step 1430. During step 1430, the corrected word c'1c'2c'3c'4c'5c'6c'7c'8 is compared with the four words '11111111', '00000000', '01010101' and '10101010'.

If the corrected word is not equal to any of these values (N), which means it has been encoded using a classical extended Hamming code, the process goes to step 1440 wherein the corrected word is decoded in a manner corresponding to that code. The value c'3c'5c'6c'7 thereby obtained is then outputted as the decoded word u1u2u3u4. Next, the process goes back to step 1410 in order to obtain a new encoded word to decode.

If the result of the comparison of step 1430 is positive (Y), the process goes to step 1450 wherein the corrected word is concatenated with the previous corrected word and compared with the word '1111111100000000'.

If the result of the comparison of step 1430 is positive (Y), the word '1111' is output as the decoded word in step 1455. The process then goes back to step 1410.

If the result of the comparison of step 1450 is negative (N), the process goes to step 1460 in order to check if the concatenated word is equal to the word '0000000011111111'.

If the result of the comparison of step 1460 is positive (Y), the word '0000' is outputted as the decoded word in step 1465 and the process goes back to step 1410.

If the result of the comparison of step 1460 is negative (N), the process goes to step 1470 in order to check if the concatenated word is equal to the word '0101010110101010'.

If the result of the comparison of step 1470 s positive (Y), the word '0010' is outputted as the decoded word in step 1475 and the process goes back to step 1410.

If the result of the comparison of step 1470 is negative (N), the process goes to step 1480 in order to check if the concatenated word is equal to the word '1010101001010101'.

If the result of the comparison of step 1480 is positive (Y), the word '1101' is output as the decoded word in step 1485 and the process goes back to step 1410.

If the result of the comparison of step 1480 is negative (N), which means that the concatenated word is not part of the codebook of FIG. 9, no decoded word is output and the process goes back to step 1410.

Figure 15:
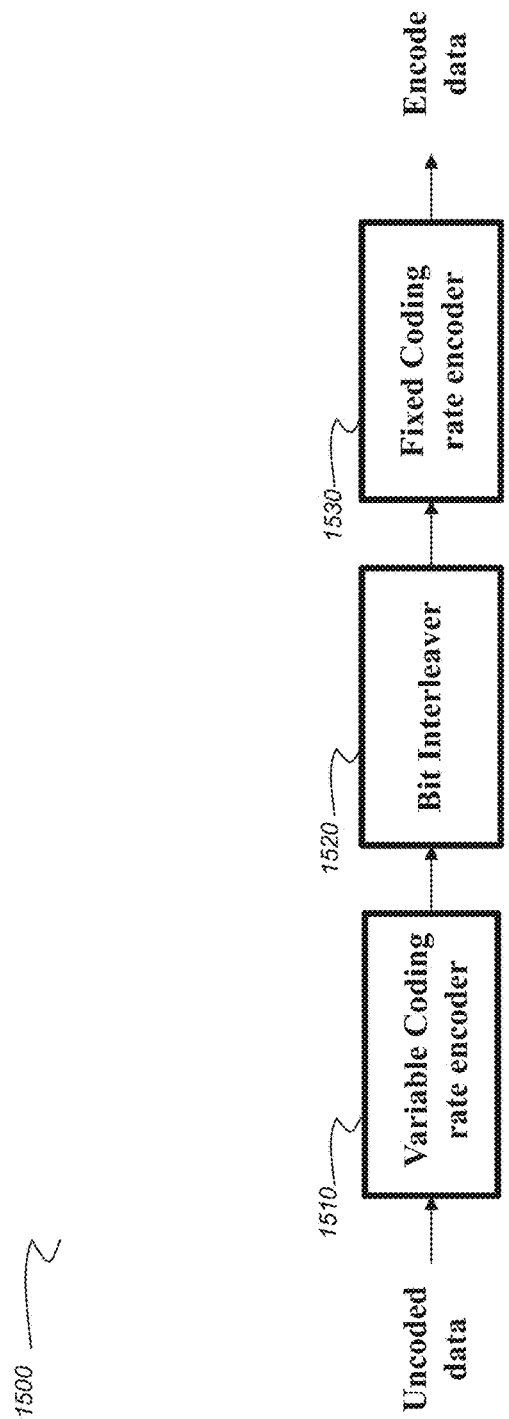
FIG. 15 schematically illustrates the concatenation of encoding with variable coding rate with encoding with fixed coding rate according to embodiments.

FIG. 15 illustrates an encoder 1500 according to embodiments wherein a fixed coding rate coding (as described hereinabove with reference to FIGS. 1 to 8) is used in combination with a variable coding rate coding (as described hereinabove with reference to FIGS. 9 to 14).

The uncoded bitstream (uncoded data) is presented at the input of a variable coding rate encoder 1510.

Encoder 1510 outputs an encoded bitstream C1 which is fed to a bit interleaver 1520.

The output V of the bit interleaver is fed to a fixed coding rate encoder 1530.

Since the length of the codewords is 8 bits, the bit interleaving carries out an interleaving on 8 successive codewords as described below.

Let's consider C1=[c1c2c3c4c5c6c7c8 . . . c57c58c59c60c61 c62c63c64] as a bitstream of 64 bits.

The interleaving applied on C1 generates the following bitstream noticed V:

V=[c1c9c17c25c33c41c49c57c2c10c18c26c34 . . . c48c56c64]

The interleaver makes sure that the bits belonging to the same codeword within the C1 bitstream are in different bytes within the V bitstream.

After the interleaving, the fixed coding rate encoder performs encoding as described for example with reference to FIG. 4 on the V bitstream in order to generate the C2 bitstream.

The mean coding rate of the line coding scheme of the FIG. 15 is equal to 0.5*7/16=7/32=0.21875.

In the above example, the variable coding rate encoder is placed before the fixed coding rate encoder. However, according to embodiments, the fixed coding rate encoder may be placed before the variable coding rate encoder.

Figure 16:
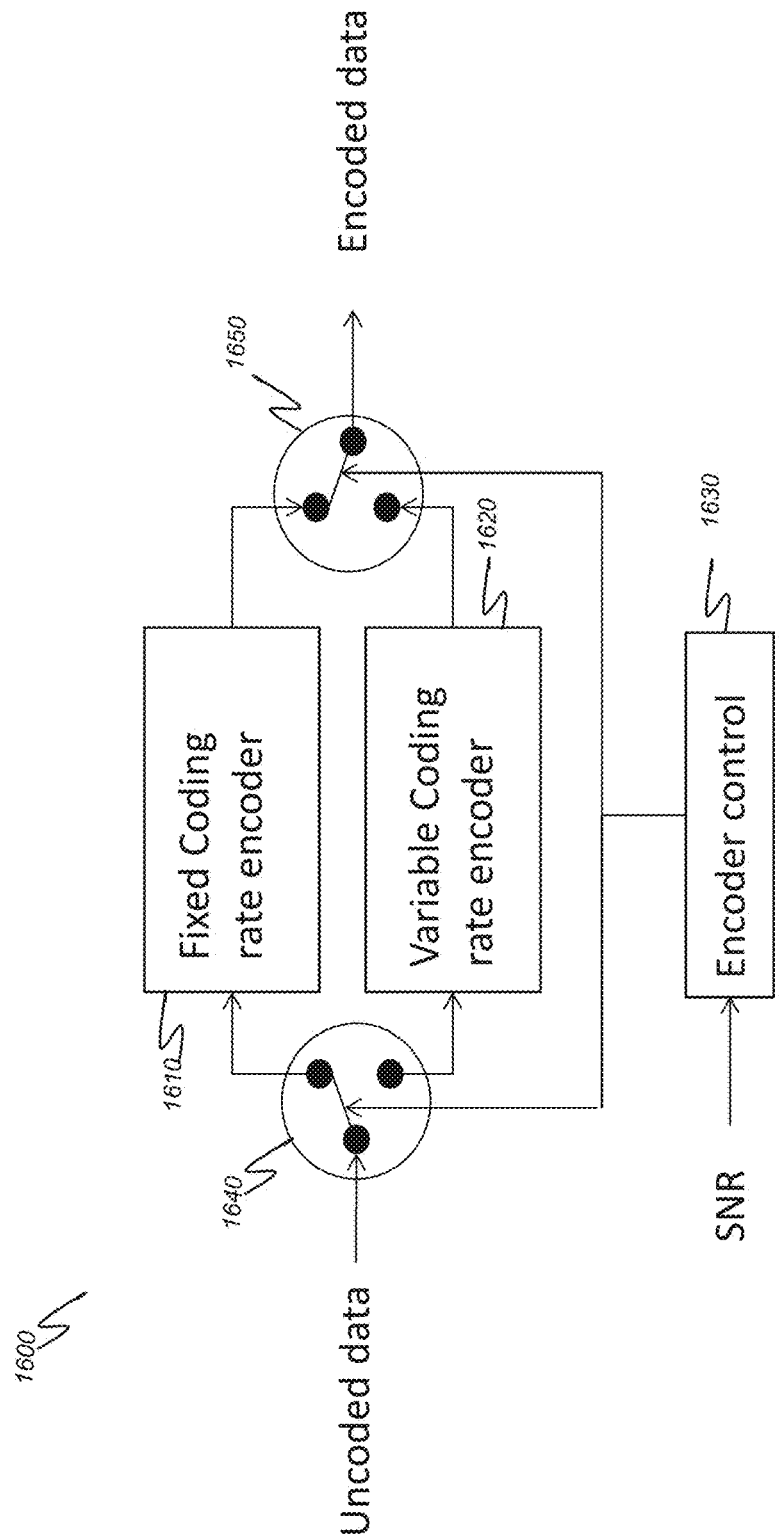
FIG. 16 schematically illustrates the architecture of a combined encoder according to embodiments using a coding scheme with fixed coding rate and a coding scheme with variable coding rate.

FIG. 16 schematically illustrates the architecture of a combined encoder according to embodiments that uses both a coding scheme with fixed coding rate and a coding scheme with variable coding rate as described hereinabove.

The simulation results shown in FIGS. 12d and 13d make it possible to conclude that the coding scheme which gives the best performance in terms of Bit Error rate is the coding scheme with fixed coding rate when the SNR is roughly less than 7.3 dB and the coding scheme with variable coding rate when the SNR is above 7.3 dB.

It may thus be desirable to optimize the BER performance by selecting the appropriate coding scheme as a function of the SNR value.

The combined encoder 1600 comprises an encoder 1610 with fixed coding rate, an encoder 1620 with variable coding rate, two switches 1640 and 1650 and an encoder controller 1630.

Depending on the SNR value of the communication between a transmitter and a receiver (not represented), the encoder controller sets the position of the switches in order to use the most appropriate encoding scheme.

For instance, if the SNR value is less than 7.3 dB, the switches are set as illustrated in FIG. 16 and the fixed coding rate encoder is used. Otherwise, if the SNR value is equal or greater than 7.3 dB, the switches are set in the complementary position and the variable coding rate encoder is used.

The SNR value may be obtained by any means available in the art. For instance, the SNR may be measured at the receiver during a previous communication on the basis of the number of errors while receiving a known data series and sent back to the transmitter for the optimization of the communication parameters (process commonly used).

In case of a communication system using one transmitter and several receivers, it may happen that the SNR values measured on receiver are not on the same level with regard to the SNR threshold used for selecting the appropriate coding scheme. In such case, the encoder controller may be configured to select always the encoder with fixed coding rate or the encoder with variable coding rate or to apply a majority rule on the SNR values. In any case, the decision taken by the encoder controller is forwarded to the receivers by insertion of an appropriate data in the header of the frames containing the transmitted data.

While the invention has been illustrated and described in detail in the drawings and foregoing description, such illustration and description are to be considered illustrative or exemplary and not restrictive, the invention being not restricted to the disclosed embodiment. Other variations to the disclosed embodiment can be understood and effected by those skilled in the art in practicing the claimed invention, from a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A method of terahertz communication by encoding a bitstream, the encoding comprising:
   obtaining at least one current input word of the bitstream to encode;
   determining a variable codeword and a fixed codeword from the at least one current input word;
   selecting the variable codeword or a fixed codeword based on a signal-to-noise ratio (SNR) value; and
   outputting an encoded word including the selected variable codeword or fixed codeword, wherein determining the variable codeword comprises:
determining at least one nominal codeword associated with the at least one input word according to an error-control code and according to an error-control codebook,
determining a substitute codeword having a size different from the size of the nominal codeword and comprising a concatenation of the nominal codeword with a complementary bit sequence that is a codeword of the codebook, the substitute codeword having a digital sum and/or an alternate sum that keeps a current running digital sum and/or a running alternate sum bounded, and
selecting one of the at least one nominal codeword or the substitute codeword as the variable codeword.

2. The method according to claim 1, further comprising:
obtaining a plurality of input words of the bitstream; and
determining a plurality of nominal codewords associated with the plurality of input words according to the error-control code,
wherein an encoded word is output for each nominal codeword, and
wherein the current running digital sum and/or running alternate sum is of an encoded bitstream comprising the encoded words.

3. The method according to claim 1, wherein the nominal codeword is a Hamming codeword.

4. The method according to claim 1, wherein the substitute codeword has a digital sum and/or an alternate sum that keeps the current running digital sum and/or the running alternate sum null.

5. The method of claim 1 wherein the SNR value is obtained during a previous communication on basis of number of errors while receiving a known data series.

6. The method of claim 1 wherein the SNR value is obtained using a majority rule on a plurality of receivers.

7. A method of terahertz communication by decoding a bitstream, the decoding comprising:
obtaining input encoded words of the bitstream to decode;
carrying out error correction on the input encoded words using an error-control code, thereby obtaining corrected encoded words; and
determining a variable decoded word or a fixed decoded word based on a signal-to-noise ratio (SNR) value;
wherein determining the variable decoded word comprises:
determining whether the corrected encoded words comprise a substitute codeword,
outputting the variable decoded word based on the substitute codeword if it is determined that the corrected encoded words comprise a substitute codeword, and
outputting variable decoded words by association of corrected encoded words not forming part of a substitute codeword, with variable decoded words according to the error-control code,
wherein the nominal codeword is determined according to an error-control code codebook, and
wherein the substitute codeword has a size different from the size of the nominal codeword and comprises a concatenation of the nominal codeword with a complementary bit sequence that is a codeword of the codebook, the substitute codeword having a digital sum and/or an alternate sum that keeps the current running digital sum and/or the running alternate sum bounded.

8. The method according to claim 7, wherein the substitute codeword kept a current running digital sum and/or a running alternate sum bounded during encoding of the encoded word.

9. The method according to claim 7, wherein the error-control code is a Hamming code.

10. A device for terahertz communication by encoding a bitstream, the device comprising a control unit configured to:
obtain at least one current input word of the bitstream to encode;
determine a variable codeword and a fixed codeword from the at least one current input word;
selecting the variable codeword or a fixed codeword based on a signal-to-noise ratio (SNR) value; and
outputting an encoded word including the selected variable codeword or fixed codeword,
wherein to determine the variable codeword comprises to:
determine at least one nominal codeword associated with the at least one input word according to an error-control code and according to an error-control codebook,
determine a substitute codeword having a size different from the size of the nominal codeword and comprising a concatenation of the nominal codeword with a complementary bit sequence that is a codeword of the codebook, the substitute codeword having a digital sum and/or an alternate sum that keeps a current running digital sum and/or a running alternate sum bounded, and
select one of the at least one nominal codeword or the substitute codeword as a selected codeword.

11. The device according to claim 10, wherein the control unit is further configured to:
obtain a plurality of input words of the bitstream,
determine a plurality of nominal codewords associated with the plurality of input words according to the error-control code, and
output an encoded word for each nominal codeword,
wherein the current running digital sum and/or running alternate sum is of an encoded bitstream comprising the encoded words.

12. The device according to claim 10, wherein the nominal codeword is a Hamming codeword.

* * * * *